United States Patent
Uchida et al.

(10) Patent No.: US 11,811,225 B2
(45) Date of Patent: Nov. 7, 2023

(54) MOTOR POWER SUPPLY DEVICE

(71) Applicant: AISIN CORPORATION, Aichi (JP)

(72) Inventors: Yutaka Uchida, Kariya (JP); Takanori Suzuki, Kariya (JP); Kohei Yamazaki, Kariya (JP)

(73) Assignee: AISIN CORPORATION, Aichi (JP)

( * ) Notice: Subject to any disclaimer, the term of this patent is extended or adjusted under 35 U.S.C. 154(b) by 0 days.

(21) Appl. No.: 17/714,200

(22) Filed: Apr. 6, 2022

(65) Prior Publication Data
US 2022/0329067 A1 Oct. 13, 2022

(30) Foreign Application Priority Data

Apr. 8, 2021 (JP) .................................. 2021-066110

(51) Int. Cl.
| G05B 5/00 | (2006.01) |
| H02J 1/10 | (2006.01) |
| H02J 7/14 | (2006.01) |
| H02P 7/292 | (2016.01) |
| H02P 9/30 | (2006.01) |

(52) U.S. Cl.
CPC ............ *H02J 1/108* (2013.01); *H02J 7/1423* (2013.01); *H02P 7/292* (2013.01); *H02P 9/305* (2013.01)

(58) Field of Classification Search
CPC ......... H02J 1/108; H02J 7/1423; H02P 7/292; H02P 9/305; H02P 29/024; H02P 2101/45
See application file for complete search history.

(56) References Cited

U.S. PATENT DOCUMENTS 8,547,043 B2    10/2013  Kuroda
2012/0068546 A1  3/2012  Kuramochi et al.

FOREIGN PATENT DOCUMENTS

| CN | 205605748 U | * | 9/2016 | |
| JP | 2007-145208 A | | 6/2007 | |
| JP | 2010-140785 A | | 6/2010 | |
| JP | 2013-102478 A | | 5/2013 | |
| WO | WO-2020246123 A1 | * | 12/2020 | ............ H02J 7/0019 |
| WO | 2021/049174 A1 | | 3/2021 | |

OTHER PUBLICATIONS

Extended European Search Report dated Aug. 25, 2022 in Application No. 22165285.2.

* cited by examiner

Primary Examiner — Karen Masih
(74) Attorney, Agent, or Firm — Sughrue Mion, PLLC

(57) ABSTRACT

A motor power supply device includes a first power supply, a motor driven by a power supplied from the first power supply, a first power supply line, a first power supply side semiconductor switch, a first output side semiconductor switch, a first power supply side voltage detection unit disposed on a first power supply side with respect to the first power supply side semiconductor switch on the first power supply line and configured to detect a voltage of the first power supply line, and a control unit configured to execute control to determine a state of power supply from the first power supply to the first power supply side semiconductor switch based on a measured value obtained by the first power supply side voltage detection unit.

7 Claims, 18 Drawing Sheets

FIG.5
FIRST DIAGNOSIS STATE (FIRST MAIN SEMICONDUCTOR SWITCH)

|  | NORMAL TIME | OFF FAILURE TIME |
|---|---|---|
| FIRST MAIN VOLTAGE DETECTION UNIT | H | H |
| SECOND MAIN VOLTAGE DETECTION UNIT | H | L |

FIG.6
FIRST DIAGNOSIS STATE (SECOND MAIN SEMICONDUCTOR SWITCH)

|  | NORMAL TIME | OFF FAILURE TIME |
|---|---|---|
| FIRST MAIN VOLTAGE DETECTION UNIT | H | H |
| SECOND MAIN VOLTAGE DETECTION UNIT | H | L |

FIG.7
FIRST DIAGNOSIS STATE (FIRST SUB SEMICONDUCTOR SWITCH)

|  | NORMAL TIME | OFF FAILURE TIME |
|---|---|---|
| FIRST SUB VOLTAGE DETECTION UNIT | H | H |
| SECOND SUB VOLTAGE DETECTION UNIT | H | L |
| THIRD SUB VOLTAGE DETECTION UNIT | H | L |
| FOURTH SUB VOLTAGE DETECTION UNIT | – | – |

FIG.8
FIRST DIAGNOSIS STATE (SECOND SUB SEMICONDUCTOR SWITCH)

|  | NORMAL TIME | OFF FAILURE TIME |
|---|---|---|
| FIRST SUB VOLTAGE DETECTION UNIT | H | H |
| SECOND SUB VOLTAGE DETECTION UNIT | H | H |
| THIRD SUB VOLTAGE DETECTION UNIT | H | L |
| FOURTH SUB VOLTAGE DETECTION UNIT | – | – |

FIG.9

SECOND DIAGNOSIS STATE (SECOND MAIN SEMICONDUCTOR SWITCH)

|  | NORMAL TIME | ON FAILURE TIME |
|---|---|---|
| FIRST MAIN VOLTAGE DETECTION UNIT | H | H |
| SECOND MAIN VOLTAGE DETECTION UNIT | L | H |

FIG.10

SECOND DIAGNOSIS STATE (FIRST SUB SEMICONDUCTOR SWITCH)

|  | NORMAL TIME | ON FAILURE TIME |
|---|---|---|
| FIRST SUB VOLTAGE DETECTION UNIT | H | H |
| SECOND SUB VOLTAGE DETECTION UNIT | L | H |
| THIRD SUB VOLTAGE DETECTION UNIT | L | H |
| FOURTH SUB VOLTAGE DETECTION UNIT | − | − |

FIG.11

SECOND DIAGNOSIS STATE (FOURTH SUB SEMICONDUCTOR SWITCH)

|  | NORMAL TIME | ON FAILURE TIME |
|---|---|---|
| FIRST SUB VOLTAGE DETECTION UNIT | − | − |
| SECOND SUB VOLTAGE DETECTION UNIT | L | L |
| THIRD SUB VOLTAGE DETECTION UNIT | L | H |
| FOURTH SUB VOLTAGE DETECTION UNIT | H | H |

FIG.12

THIRD DIAGNOSIS STATE (SECOND SUB SEMICONDUCTOR SWITCH)

|  | NORMAL TIME | ON FAILURE TIME |
|---|---|---|
| FIRST SUB VOLTAGE DETECTION UNIT | H | H |
| SECOND SUB VOLTAGE DETECTION UNIT | L | H |
| THIRD SUB VOLTAGE DETECTION UNIT | H | H |
| FOURTH SUB VOLTAGE DETECTION UNIT | (H) | – |

FIG.13

THIRD DIAGNOSIS STATE (FOURTH SUB SEMICONDUCTOR SWITCH)

|  | NORMAL TIME | OFF FAILURE TIME |
|---|---|---|
| FIRST SUB VOLTAGE DETECTION UNIT | – | – |
| SECOND SUB VOLTAGE DETECTION UNIT | L | L |
| THIRD SUB VOLTAGE DETECTION UNIT | H | L |
| FOURTH SUB VOLTAGE DETECTION UNIT | H | H |

SECOND EMBODIMENT

SECOND DIAGNOSIS STATE (FOURTH SUB SEMICONDUCTOR SWITCH)

| | NORMAL TIME | OFF FAILURE TIME |
|---|---|---|
| FIRST SUB VOLTAGE DETECTION UNIT | - | - |
| SECOND SUB VOLTAGE DETECTION UNIT | L | L |
| THIRD SUB VOLTAGE DETECTION UNIT | H | L |
| FOURTH SUB VOLTAGE DETECTION UNIT | H | H |

THIRD EMBODIMENT

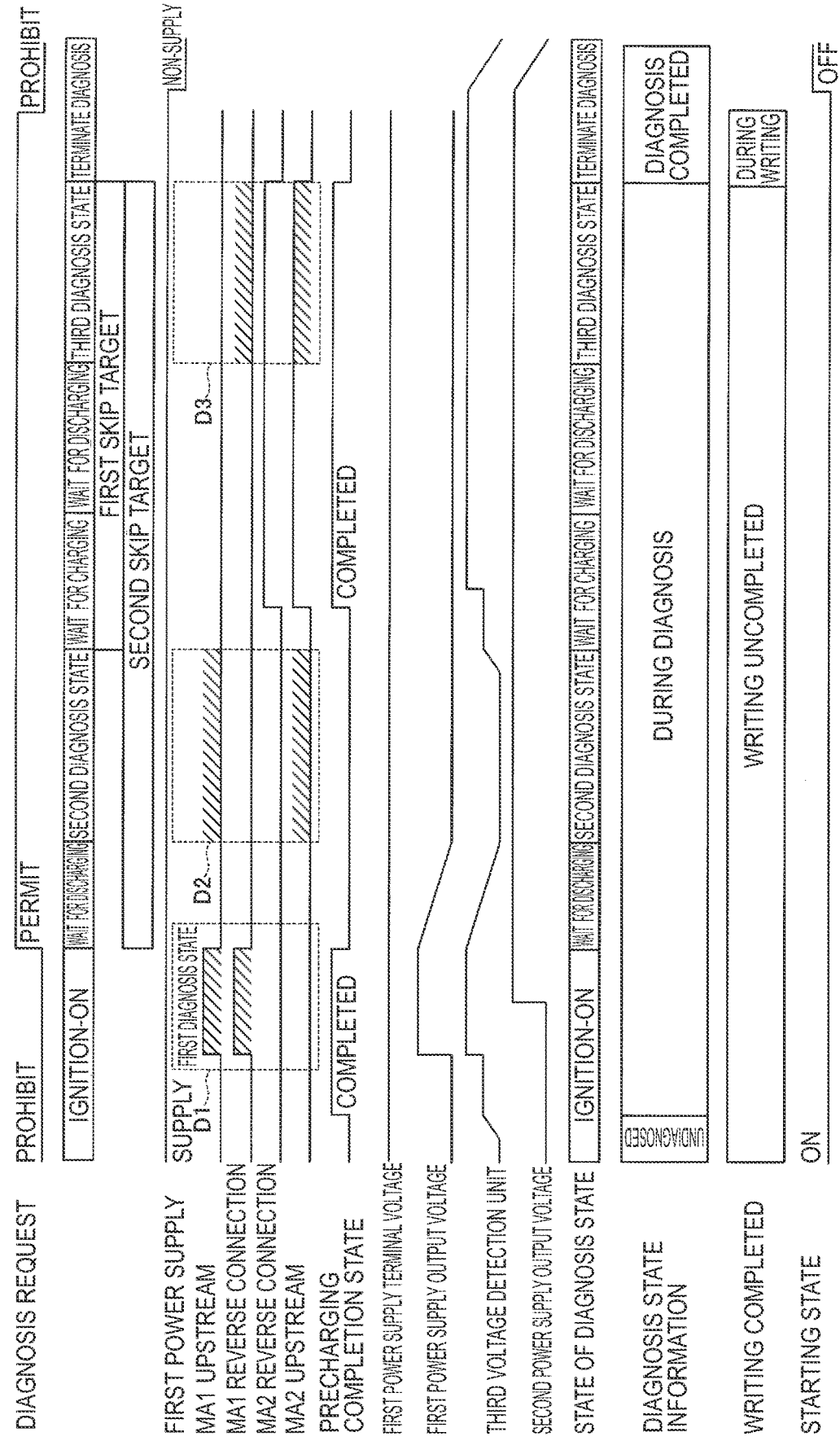

FIG.22

FIRST DIAGNOSIS STATE (FIRST SEMICONDUCTOR SWITCH)

|  | NORMAL TIME | OFF FAILURE TIME |
|---|---|---|
| FIRST SUB VOLTAGE DETECTION UNIT | H | H |
| SECOND SUB VOLTAGE DETECTION UNIT | H | L |
| THIRD SUB VOLTAGE DETECTION UNIT | H | L |
| FOURTH SUB VOLTAGE DETECTION UNIT | – | – |

FIG.23

FIRST DIAGNOSIS STATE (SECOND SEMICONDUCTOR SWITCH)

|  | NORMAL TIME | OFF FAILURE TIME |
|---|---|---|
| FIRST SUB VOLTAGE DETECTION UNIT | H | H |
| SECOND SUB VOLTAGE DETECTION UNIT | H | H |
| THIRD SUB VOLTAGE DETECTION UNIT | H | L |
| FOURTH SUB VOLTAGE DETECTION UNIT | – | – |

FIG.24

SECOND DIAGNOSIS STATE (FIRST SEMICONDUCTOR SWITCH)

|  | NORMAL TIME | ON FAILURE TIME |
|---|---|---|
| FIRST SUB VOLTAGE DETECTION UNIT | H | H |
| SECOND SUB VOLTAGE DETECTION UNIT | L | H |
| THIRD SUB VOLTAGE DETECTION UNIT | L | H |
| FOURTH SUB VOLTAGE DETECTION UNIT | – | – |

FIG.25

SECOND DIAGNOSIS STATE (FOURTH SEMICONDUCTOR SWITCH)

|  | NORMAL TIME | ON FAILURE TIME |
|---|---|---|
| FIRST SUB VOLTAGE DETECTION UNIT | (H) | — |
| SECOND SUB VOLTAGE DETECTION UNIT | L | L |
| THIRD SUB VOLTAGE DETECTION UNIT | L | H |
| FOURTH SUB VOLTAGE DETECTION UNIT | H | H |

FIG.26

THIRD DIAGNOSIS STATE (SECOND SEMICONDUCTOR SWITCH)

|  | NORMAL TIME | ON FAILURE TIME |
|---|---|---|
| FIRST SUB VOLTAGE DETECTION UNIT | H | H |
| SECOND SUB VOLTAGE DETECTION UNIT | L | H |
| THIRD SUB VOLTAGE DETECTION UNIT | H | H |
| FOURTH SUB VOLTAGE DETECTION UNIT | — | — |

FIG.27

THIRD DIAGNOSIS STATE (FOURTH SEMICONDUCTOR SWITCH)

|  | NORMAL TIME | OFF FAILURE TIME |
|---|---|---|
| FIRST SUB VOLTAGE DETECTION UNIT | (H) | — |
| SECOND SUB VOLTAGE DETECTION UNIT | L | L |
| THIRD SUB VOLTAGE DETECTION UNIT | H | L |
| FOURTH SUB VOLTAGE DETECTION UNIT | H | H |

MOTOR POWER SUPPLY DEVICE

CROSS REFERENCE TO RELATED APPLICATIONS

This application is based on and claims priority under 35 U.S.C. § 119 to Japanese Patent Application 2021-066110, filed on Apr. 8, 2021, the entire content of which is incorporated herein by reference.

TECHNICAL FIELD

This disclosure relates to a motor power supply device, and more particularly to a motor power supply device that supplies a power for driving a motor.

BACKGROUND DISCUSSION

In the related art, a motor power supply device that supplies a power for driving a motor is known (for example, see JP 2013-102478A (Reference 1)).

Reference 1 described above discloses the power supply unit (motor power supply device) that supplies the power for driving the motor. The power supply unit includes a main power supply, a sub power supply, a sub power supply line, a first MOSFET, a second MOSFET, and a microcomputer. The sub power supply is provided separately from the main power supply. The sub power supply line is connected to the sub power supply and supplies the power from the sub power supply to the motor. The first MOSFET is disposed on a sub power supply side with respect to the second MOSFET on the sub power supply line. The second MOSFET is connected in series with the first MOSFET on the sub power supply line. The microcomputer controls on and off of each of the first MOSFET and the second MOSFET.

The microcomputer in Reference 1 described above determines the presence or absence of a short-circuit failure or an open-circuit failure of each of the first MOSFET and the second MOSFET in a state in which the first MOSFET and the second MOSFET are turned on and off.

However, in the power supply unit in Reference 1, described above when a ground fault occurs between the sub power supply on the sub power supply line and the first MOSFET, and an on failure diagnosis of the first MOSFET and an off failure diagnosis of the first MOSFET may be erroneously determined. Specifically, in a case in which a failure of the first MOSFET is diagnosed with the first MOSFET turned on and the second MOSFET turned off, when the ground fault occurs between the sub power supply and the first MOSFET on the sub power supply line, a voltage of the first MOSFET is 0 V. In this case, even if an on operation of the first MOSFET is normal, the microcomputer erroneously determines that the first MOSFET is in the open-circuit failure. In the open-circuit failure, an off state of the first MOSFET cannot be released. In a case in which a failure of the first MOSFET is diagnosed with the first MOSFET and the second MOSFET turned off, when the ground fault occurs between the sub power supply and the first MOSFET on the sub power supply line, the voltage of the first MOSFET is 0 V. In this case, even if a short failure (short-circuit failure) occurs in the first MOSFET, the microcomputer erroneously determines that an off operation of the first MOSFET is normal. As described above, in the power supply unit in Reference 1, described above when the ground fault occurs between the sub power supply (power supply) and the first MOSFET (semiconductor switch on a power supply side) on the sub power supply line (power supply line), the failure diagnosis of the first MOSFET (power supply side semiconductor switch) may be erroneously determined.

A need thus exists for a motor power supply device which is not susceptible to the drawback mentioned above.

SUMMARY

According to an aspect of this disclosure, a motor power supply device includes: a first power supply; a motor that is driven by a power supplied from the first power supply; a first power supply line that electrically connects the first power supply and the motor; a first power supply side semiconductor switch that is disposed on a first power supply side on the first power supply line; a first output side semiconductor switch that is connected in series with the first power supply side semiconductor switch on the first power supply line and that is disposed on an output side of the first power supply line; a first power supply side voltage detection unit that is disposed on the first power supply side with respect to the first power supply side semiconductor switch on the first power supply line and that is configured to detect a voltage of the first power supply line; and a control unit configured to execute control to determine a state of power supply from the first power supply to the first power supply side semiconductor switch based on a measured value obtained by the first power supply side voltage detection unit.

BRIEF DESCRIPTION OF THE DRAWINGS

The foregoing and additional features and characteristics of this disclosure will become more apparent from the following detailed description considered with the reference to the accompanying drawings, wherein:

FIG. 5 is a table showing a diagnosis result of a first main semiconductor switch of the motor power supply device in a first diagnosis state according to the first embodiment;

FIG. 6 is a table showing a diagnosis result of a second main semiconductor switch of the motor power supply device in the first diagnosis state according to the first embodiment;

FIG. 7 is a table showing a diagnosis result of a first sub semiconductor switch of the motor power supply device in the first diagnosis state according to the first embodiment;

FIG. 8 is a table showing a diagnosis result of a second sub semiconductor switch of the motor power supply device in the first diagnosis state according to the first embodiment;

FIG. 9 is a table showing a diagnosis result of the second main semiconductor switch of the motor power supply device in a second diagnosis state according to the first embodiment;

FIG. 10 is a table showing a diagnosis result of the first sub semiconductor switch of the motor power supply device in the second diagnosis state according to the first embodiment;

FIG. 11 is a table showing a diagnosis result of a fourth sub semiconductor switch of the motor power supply device in the second diagnosis state according to the first embodiment;

FIG. 12 is a table showing a diagnosis result of the second sub semiconductor switch of the motor power supply device in a third diagnosis state according to the first embodiment;

FIG. 13 is a table showing a diagnosis result of the fourth sub semiconductor switch of the motor power supply device in the third diagnosis state according to the first embodiment;

FIG. 21 is a timing chart of a failure diagnosis in the motor power supply device according to the third embodiment;

FIG. 22 is a table showing a diagnosis result of a first semiconductor switch of the motor power supply device in a first diagnosis state according to the third embodiment;

FIG. 23 is a table showing a diagnosis result of a second semiconductor switch of the motor power supply device in the first diagnosis state according to the third embodiment;

FIG. 24 is a table showing a diagnosis result of a first sub semiconductor switch of the motor power supply device in a second diagnosis state according to the third embodiment;

FIG. 25 is a table showing a diagnosis result of a fourth semiconductor switch of the motor power supply device in the second diagnosis state according to the third embodiment;

FIG. 26 is a table showing a diagnosis result of the second semiconductor switch of the motor power supply device in a third diagnosis state according to the third embodiment;

FIG. 27 is a table showing a diagnosis result of the fourth semiconductor switch of the motor power supply device in the third diagnosis state according to the third embodiment;

DETAILED DESCRIPTION

Hereinafter, embodiments disclosed here will be described with reference to the drawings.

First Embodiment

A configuration of a motor power supply device 3 according to a first embodiment will be described with reference to FIGS. 1 to 13. The motor power supply device 3 is a device that drives a motor 11 of a shift device 100.

Figure 1:
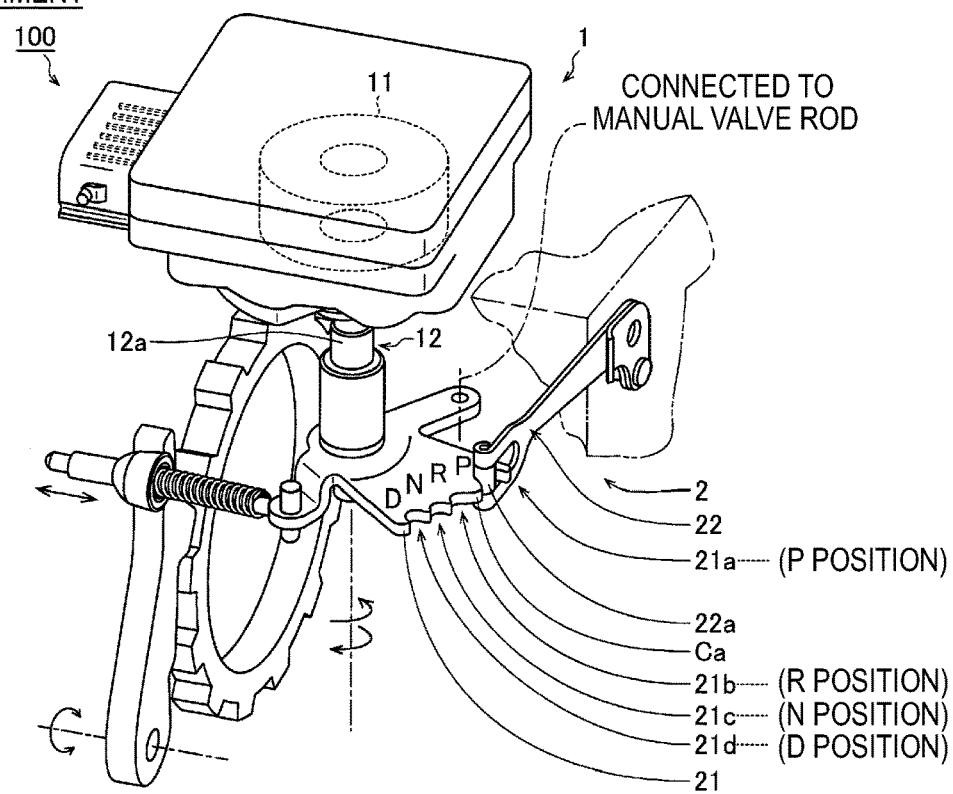
FIG. 1 is a perspective view schematically showing an overall configuration of a shift device according to a first embodiment.

The shift device 100 is mounted on a vehicle such as an automobile. As shown in FIG. 1, when an occupant (driver) performs a shift switching operation via an operation unit such as a shift lever (or a shift switch), a transmission mechanism is subjected to an electrical shift switching control in the vehicle. That is, a position of the shift lever is input to a shift device 100 side via a shift sensor provided in the operation unit. Then, based on a control signal transmitted from a dedicated main side microcomputer 31i and a sub side microcomputer 32o that are provided in the shift device 100, which will be described later, the transmission mechanism is switched to any one of shift positions of a parking (P) position, a reverse (R) position, a neutral (N) position, and a drive (D) position corresponding to a shift operation of the occupant. Such a shift switching control is called shift-by-wire (SBW).

Figure 3:
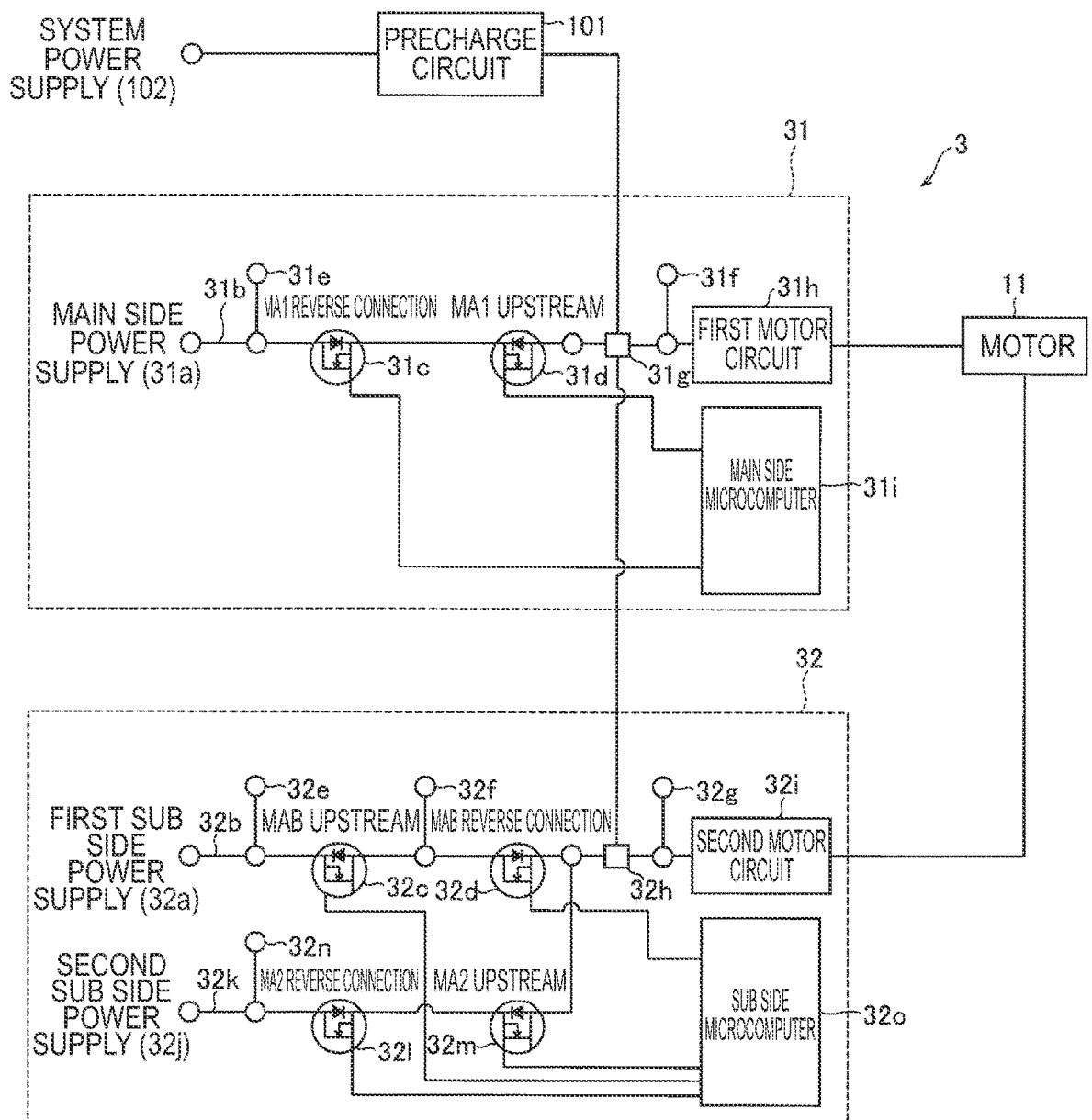
FIG. 3 is a view schematically showing a configuration of a motor power supply device according to the first embodiment.

The shift device 100 includes an actuator unit 1, a shift switching mechanism 2, and a motor power supply device 3 (see FIG. 3). The shift switching mechanism 2 is mechanically connected to a manual spool valve (not shown) of a hydraulic valve body in a hydraulic control circuit unit (not shown) and a parking mechanism in the transmission mechanism. Further, a shift state (the P position, the R position, the N position, and the D position) of a transmission is mechanically switched by driving the shift switching mechanism 2.

The actuator unit 1 includes the motor 11 and a driving force transmission mechanism 12. The motor 11 is a motor that drives a detent plate 21, which will be described later. The motor 11 is a surface magnet type (SPM) three-phase motor in which a permanent magnet is incorporated on a surface of a rotor. The driving force transmission mechanism 12 transmits a driving force of the motor 11 to the detent plate 21. The driving force transmission mechanism 12 includes a speed reducing mechanism (not shown) and an output shaft 12a.

As shown in FIG. 1, the shift switching mechanism 2 is driven by the actuator unit 1. The shift switching mechanism 2 includes the detent plate 21 and a detent spring 22. The detent spring 22 holds the detent plate 21 at rotation angle positions each corresponding to a respective one of the P position, the R position, the N position, and the D position.

Figure 2:
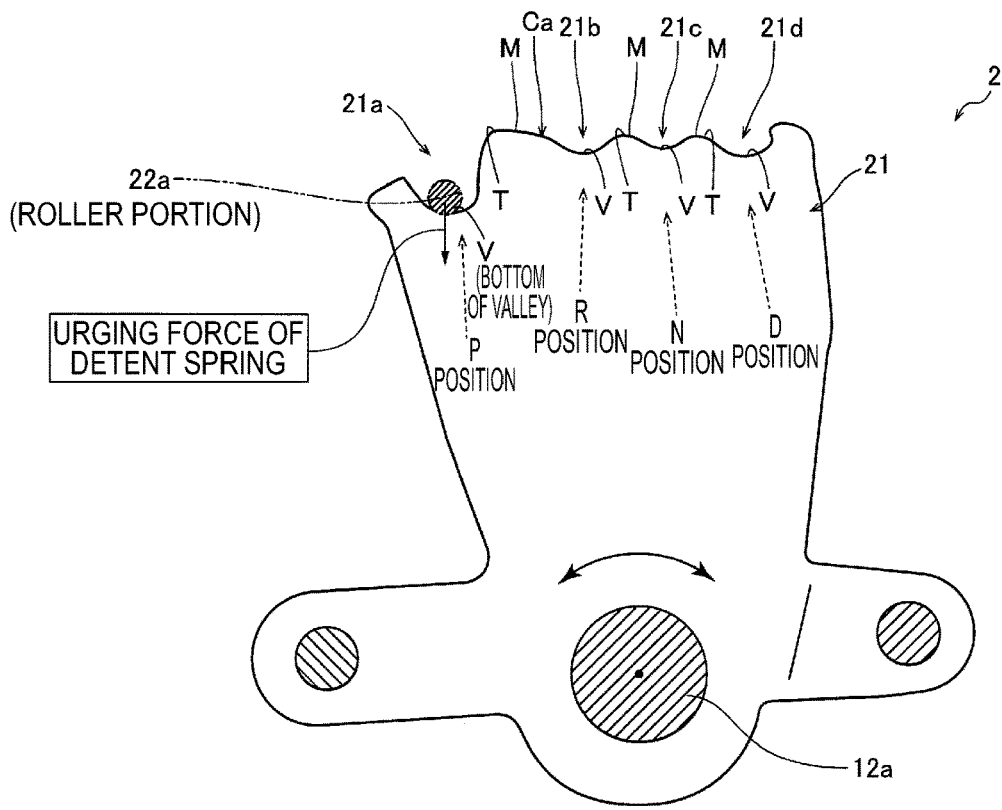
FIG. 2 is a view showing a structure of a detent plate constituting the shift device according to the first embodiment.

As shown in FIG. 2, the detent plate 21 includes a plurality of (four) valley portions, that is, a valley portion 21a, a valley portion 21b, a valley portion 21c, and a valley portion 21d corresponding to the shift positions (the P position, the R position, the N position, and the D position). The valley portion 21a, the valley portion 21b, the valley portion 21c, and the valley portion 21d form a cam surface Ca having a continuous undulating shape on the detent plate 21. Further, adjacent valleys portions (for example, the valley portions 21a and 21b, and the valley portions 21b and 21c) are separated by a mountain portion M having one top portion T. A base end portion of the detent spring 22 is fixed to a casing of the transmission mechanism, and a roller portion 22a is attached to a free end side of the detent spring 22. Further, in the detent spring 22, the roller portion 22a always presses the cam surface Ca (the position of any of the valley portion 21a, the valley portion 21b, the valley portion 21c, the valley portion 21d, or the mountain portions M). Further, the detent spring 22 establishes a shift position in a state of being fitted in any of the plurality of valley portions, that is, the valley portion 21a, the valley portion 21b, the valley portion 21c, and the valley portion 21d.

As shown in FIG. 3, the motor power supply device 3 supplies a power to the actuator unit 1. The motor power supply device 3 includes a main side power supply unit 31 and a sub side power supply unit 32. The motor 11 is driven by the power supplied from each of the main side power supply unit 31 and the sub side power supply unit 32.

The main side power supply unit 31 includes a main side power supply 31a (an example of a "first power supply" in the claims), a main power supply line 31b (an example of a "first power supply line" in the claims), a first main semiconductor switch 31c (an example of a "first power supply side semiconductor switch" in the claims), and a second main semiconductor switch 31d (an example of a "first output side semiconductor switch" in the claims).

The main side power supply 31a is a lithium battery, a capacitor, or the like. The main power supply line 31b electrically connects the main side power supply 31a and the motor 11. Each of the first main semiconductor switch 31c and the second main semiconductor switch 31d is a field effect transistor (FET). The first main semiconductor switch 31c is disposed on a main side power supply 31a side on the main power supply line 31b. The second main semiconductor switch 31d is connected in series with the first main semiconductor switch 31c on the main power supply line 31b and is disposed on an output side of the main power supply line 31b.

The main side power supply unit 31 includes a first main voltage detection unit 31e (an example of a "first power supply side voltage detection unit" in the claims) and a second main voltage detection unit 31f (an example of an "output side voltage detection unit" in the claims). The first main voltage detection unit 31e detects a voltage between the main side power supply 31a and the first main semiconductor switch 31c on the main power supply line 31b. The first main voltage detection unit 31e is disposed on the main side power supply 31a side with respect to the first main semiconductor switch 31c on the main power supply line 31b. The second main voltage detection unit 31f detects a voltage on a motor 11 side with respect to the second main semiconductor switch 31d on the main power supply line 31b. The second main voltage detection unit 31f is disposed on the motor 11 side with respect to the second main voltage detection unit 31f on the main power supply line 31b.

The main side power supply unit 31 includes a main capacitor 31g (an example of a "precharge capacitor" in the claims) and a first motor circuit 31h. The main capacitor 31g is precharged by a system power supply 102 (an example of an "external power supply" in the claims) electrically connected via a precharge circuit 101. The main capacitor 31g is disposed on the main side power supply 31a side with respect to the second main voltage detection unit 31f on the main power supply line 31b. The first motor circuit 31h transmits a control signal for controlling the motor 11 to the motor 11.

The main side power supply unit 31 includes the main side microcomputer 31i (an example of a "control unit" in the claims). The main side microcomputer 31i controls on and off of each of the first main semiconductor switch 31c and the second main semiconductor switch 31d. The main side microcomputer 31i is electrically connected to each of the first main voltage detection unit 31e, the second main voltage detection unit 31f, the first main semiconductor switch 31c, and the second main semiconductor switch 31d. The main side microcomputer 31i includes a central processing unit (CPU) and a storage unit including a memory such as a read only memory (ROM) and a random access memory (RAM).

The sub side power supply unit 32 includes a first sub side power supply 32a (an example of the "first power supply" in the claims), a first sub power supply line 32b (an example of the "first power supply line" in the claims), a first sub semiconductor switch 32c (an example of a "first power supply side semiconductor switch" in the claims), and a second sub semiconductor switch 32d (an example of a "first output side semiconductor switch" in the claims).

The first sub power supply line 32b electrically connects the first sub side power supply 32a and the motor 11. Each of the first sub semiconductor switch 32c and the second sub semiconductor switch 32d is a FET. The first sub semiconductor switch 32c is disposed on a first sub side power supply 32a side on the first sub power supply line 32b. The second sub semiconductor switch 32d is connected in series with the first sub semiconductor switch 32c on the first sub power supply line 32b and is disposed on an output side of the first sub power supply line 32b.

The sub side power supply unit 32 includes a first sub voltage detection unit 32e (an example of the "first power supply side voltage detection unit" in the claims), a second sub voltage detection unit 32f (an example of an "intermediate voltage detection unit" in the claims), and a third sub voltage detection unit 32g (an example of the "output side voltage detection unit" in the claims).

The first sub voltage detection unit 32e detects a voltage between the first sub side power supply 32a and the first sub semiconductor switch 32c on the first sub power supply line 32b. The first sub voltage detection unit 32e is disposed on the first sub side power supply 32a side with respect to the first sub semiconductor switch 32c on the first sub power supply line 32b. The second sub voltage detection unit 32f detects a voltage between the first sub semiconductor switch 32c and the second sub semiconductor switch 32d on the first sub power supply line 32b. The second sub voltage detection unit 32f is disposed between the first sub semiconductor switch 32c and the second sub semiconductor switch 32d on the first sub power supply line 32b. The third sub voltage detection unit 32g detects a voltage on the motor 11 side with respect to the second sub semiconductor switch 32d on the first sub power supply line 32b. The third sub voltage detection unit 32g is disposed on the motor 11 side with respect to the second sub voltage detection unit 32f on the first sub power supply line 32b.

The sub side power supply unit 32 includes a sub capacitor 32h ("precharge capacitor" in the claims) and a second motor circuit 32i. The sub capacitor 32h is precharged by the system power supply 102 electrically connected via the precharge circuit 101. The sub capacitor 32h is disposed on the first sub side power supply 32a side with respect to the second sub voltage detection unit 32f on the first sub power supply line 32b. The second motor circuit 32i transmits a control signal for controlling the motor 11 to the motor 11.

The sub side power supply unit 32 includes a second sub side power supply 32j (an example of a "second power supply" in the claims), a second sub power supply line 32k (an example of a "second power supply line" in the claims), a third sub semiconductor switch 32l (an example of a "second power supply side semiconductor switch" in the claims), and a fourth sub semiconductor switch 32m (an example of a "second output side semiconductor switch" in the claims).

The second sub side power supply 32j is provided separately from the first sub side power supply 32a. The second sub side power supply 32j is a lithium battery. The second sub power supply line 32k electrically connects the second sub side power supply 32j and the motor 11. Each of the third sub semiconductor switch 32l and the fourth sub semiconductor switch 32m is a FET. The third sub semiconductor switch 32l is disposed on a second sub side power supply 32j side on the second sub power supply line 32k. The fourth sub semiconductor switch 32m is connected in series with the third sub semiconductor switch 32l on the second sub power supply line 32k and is disposed on an output side of the second sub power supply line 32k.

The sub side power supply unit 32 includes a fourth sub voltage detection unit 32n (an example of a "second power supply side voltage detection unit" in the claims).

The fourth sub voltage detection unit 32n detects a voltage between the second sub side power supply 32j and the third sub semiconductor switch 32l on the second sub power supply line 32k. The fourth sub voltage detection unit 32n is disposed on the second sub side power supply 32j side with respect to the third sub semiconductor switch 32l on the second sub power supply line 32k.

The sub side power supply unit 32 includes the sub side microcomputer 32o (an example of the "control unit" in the claims). The sub side microcomputer 32o controls on and off of each of the third sub semiconductor switch 32l and the fourth sub semiconductor switch 32m. The sub side microcomputer 32o is electrically connected to each of the first sub voltage detection unit 32e, the second sub voltage detection unit 32f, the third sub voltage detection unit 32g, the fourth sub voltage detection unit 32n, the first sub semiconductor switch 32c, the second sub semiconductor switch 32d, the third sub semiconductor switch 32l, and the fourth sub semiconductor switch 32m. The sub side microcomputer 32o includes a CPU and a storage unit including a memory such as a ROM and a RAM.

Failure Diagnosis

As shown in FIG. 3, in the motor power supply device 3 according to the first embodiment, in order to prevent an erroneous diagnosis of a failure for each of the first main semiconductor switch 31c, the first sub semiconductor switch 32c, and the third sub semiconductor switch 32l, the first main voltage detection unit 31e, the first sub voltage detection unit 32e, and the fourth sub voltage detection unit 32n are provided.

Specifically, in order to check whether a power from the main side power supply 31a is normally supplied, the main side microcomputer 31i executes control to determine a state of power supply from the main side power supply 31a to the first main semiconductor switch 31c based on a measured value obtained by the first main voltage detection unit 31e.

In order to check whether a power from the first sub side power supply 32a is normally supplied, the sub side microcomputer 32o executes control to determine a state of power supply from the first sub side power supply 32a to the first sub semiconductor switch 32c based on a measured value obtained by the first sub voltage detection unit 32e.

In order to check whether a power from the second sub side power supply 32j is normally supplied, the sub side microcomputer 32o executes control to determine a state of power supply from the second sub side power supply 32j to the third sub semiconductor switch 32l based on a measured value obtained by the fourth sub voltage detection unit 32n.

Figure 4:
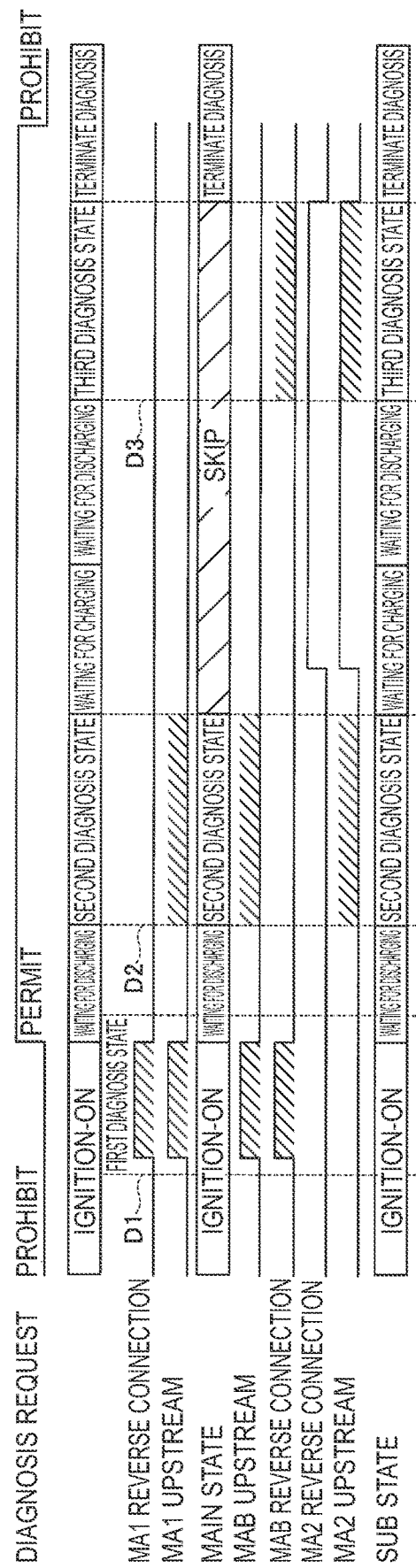
FIG. 4 is a timing chart of a failure diagnosis in the motor power supply device according to the first embodiment.

As shown in FIG. 4, the motor power supply device 3 is subjected to three types of failure diagnoses which are a first diagnosis state D1 (an example of a "first state" in the claims), a second diagnosis state D2 (an example of a "second state" and a "third state" in the claims), and a third diagnosis state D3 (an example of a "fourth state" in the claims). The first diagnosis state D1 is a failure diagnosis for a FET executed when an ignition is turned on (at a time of starting).

In the first diagnosis state D1, a failure diagnosis is executed with the first main semiconductor switch 31c and the second main semiconductor switch 31d turned on, or a failure diagnosis is executed with the first sub semiconductor switch 32c and the second sub semiconductor switch 32d turned on. The second diagnosis state D2 and the third diagnosis state D3 are failure diagnoses of a FET executed when the ignition is off (during a sleep mode). In the second diagnosis state D2, a failure diagnosis is executed with the first main semiconductor switch 31c and the second main semiconductor switch 31d turned off, or a failure diagnosis is executed with the first sub semiconductor switch 32c, the second sub semiconductor switch 32d, the third sub semiconductor switch 32l, and the fourth sub semiconductor switch 32m turned off. In the third diagnosis state D3, a failure diagnosis is executed with the third sub semiconductor switch 32l and the fourth sub semiconductor switch 32m turned on.

The first diagnosis state D1, the second diagnosis state D2, and the third diagnosis state D3 will be described below in this order.

First, before the first diagnosis state D1, the main side microcomputer 31i executes control to charge (precharge) the main capacitor 31g by supplying the power from the system power supply 102. At this time, the main side microcomputer 31i does not execute the first diagnosis state D1 based on detection of a charging abnormality of the main capacitor 31g.

Similarly, before the first diagnosis state D1, the sub side microcomputer 32o executes control to charge (precharge) the sub capacitor 32h by supplying the power from the system power supply 102. At this time, the sub side microcomputer 32o does not execute the first diagnosis state D1 based on detection of a charging abnormality of the sub capacitor 32h.

Then, as shown in FIGS. 4 and 5, the main side microcomputer 31i diagnoses a failure of the first main semiconductor switch 31c (described as "MA1 reverse connection" in FIG. 4) in the first diagnosis state D1 in which the first main semiconductor switch 31c and the second main semiconductor switch 31d are turned on.

When the first main semiconductor switch 31c is normal, the first main voltage detection unit 31e detects a voltage (described as an "H" in FIG. 5) equal to or higher than a threshold value, and the second main voltage detection unit 31f detects a voltage (described as an "H" in FIG. 5) equal to or higher than the threshold value.

When the first main semiconductor switch 31c fails, the first main voltage detection unit 31e detects a voltage (described as an "H" in FIG. 5) equal to or higher than the threshold value, and the second main voltage detection unit 31f detects a voltage (described as an "L" in FIG. 5) below the threshold value. Accordingly, an off failure of the first main semiconductor switch 31c can be detected.

As shown in FIGS. 4 and 6, the main side microcomputer 31i diagnoses a failure of the second main semiconductor switch 31d (described as "MA1 upstream" in FIG. 4) in the first diagnosis state D1 in which the first main semiconductor switch 31c and the second main semiconductor switch 31d are turned on.

When the second main semiconductor switch 31d is normal, the first main voltage detection unit 31e detects a voltage (described as an "H" in FIG. 6) equal to or higher than the threshold value, and the second main voltage detection unit 31f detects a voltage (described as an "H" in FIG. 6) equal to or higher than the threshold value.

When the second main semiconductor switch 31d fails, the first main voltage detection unit 31e detects a voltage (described as an "H" in FIG. 6) equal to or higher than the threshold value, and the second main voltage detection unit 31f detects a voltage (described as an "L" in FIG. 6) below the threshold value. Accordingly, an off failure of the second main semiconductor switch 31d can be detected.

Here, the main side microcomputer 31i executes control to terminate the first diagnosis state D1 based on the fact that a failure of at least one of the first main semiconductor switch 31c and the second main semiconductor switch 31d is detected in the first diagnosis state D1.

As shown in FIGS. 4 and 7, the sub side microcomputer 32o diagnoses, in the first diagnosis state D1 in which the first sub semiconductor switch 32c and the second sub semiconductor switch 32d are turned on, a failure of the first sub semiconductor switch 32c (described as "MAB upstream" in FIG. 4) based on voltage values detected by the first sub voltage detection unit 32e, the second sub voltage detection unit 32f, and the third sub voltage detection unit 32g.

When the first sub semiconductor switch 32c is normal, the first sub voltage detection unit 32e detects a voltage (described as an "H" in FIG. 7) equal to or higher than the threshold value, the second sub voltage detection unit 32f detects a voltage (described as an "H" in FIG. 7) equal to or higher than the threshold value, and the third sub voltage detection unit 32g detects a voltage (described as an "H" in FIG. 7) equal to or higher than the threshold value.

When the first sub semiconductor switch 32c fails, the first sub voltage detection unit 32e detects a voltage (described as an "H" in FIG. 7) equal to or higher than the threshold value, the second sub voltage detection unit 32f detects a voltage (described as an "L" in FIG. 7) below the threshold value, and the third sub voltage detection unit 32g detects a voltage (described as an "L" in FIG. 7) below the threshold value. Accordingly, an off failure of the first sub semiconductor switch 32c can be detected.

As shown in FIGS. 4 and 8, the sub side microcomputer 32o diagnoses, in the first diagnosis state D1 in which the first sub semiconductor switch 32c and the second sub semiconductor switch 32d are turned on, a failure of the second sub semiconductor switch 32d (described as "MAB reverse connection" in FIG. 4) based on the voltage values detected by the first sub voltage detection unit 32e, the second sub voltage detection unit 32f, and the third sub voltage detection unit 32g.

When the second sub semiconductor switch 32d is normal, the first sub voltage detection unit 32e detects a voltage (described as an "H" in FIG. 8) equal to or higher than the threshold value, the second sub voltage detection unit 32f detects a voltage (described as an "H" in FIG. 8) equal to or higher than the threshold value, and the third sub voltage detection unit 32g detects a voltage (described as an "H" in FIG. 8) equal to or higher than the threshold value.

When the second sub semiconductor switch 32d fails, the first sub voltage detection unit 32e detects a voltage (described as an "H" in FIG. 8) equal to or higher than the threshold value, the second sub voltage detection unit 32f detects a voltage (described as an "H" in FIG. 8) equal to or higher than the threshold value, and the third sub voltage detection unit 32g detects a voltage (described as an "L" in FIG. 8) below the threshold value. Accordingly, an off failure of the second sub semiconductor switch 32d can be detected.

Here, the sub side microcomputer 32o executes control to terminate the first diagnosis state D1 based on the fact that a failure of at least one of the first sub semiconductor switch 32c and the second sub semiconductor switch 32d is detected in the first diagnosis state D1.

As shown in FIG. 4, the main side microcomputer 31i executes control to discharge the main capacitor 31g before the second diagnosis state D2 such that the power is supplied to the second main voltage detection unit 31f. The sub side microcomputer 32o executes control to discharge the sub capacitor 32h before the second diagnosis state D2 such that the power is supplied to the second sub voltage detection unit 32f.

As shown in FIGS. 4 and 9, the main side microcomputer 31i diagnoses, in the second diagnosis state D2 in which both the first main semiconductor switch 31c and the second main semiconductor switch 31d are turned off, the failure of the second main semiconductor switch 31d (described as "MA1 upstream" in FIG. 4) based on voltage values detected by the first main voltage detection unit 31e and the second main voltage detection unit 31f.

When the second main semiconductor switch 31d is normal, the first main voltage detection unit 31e detects a voltage (described as an "H" in FIG. 9) equal to or higher than the threshold value, and the second main voltage detection unit 31f detects a voltage (described as an "L" in FIG. 9) below the threshold value.

When the second main semiconductor switch 31d fails, the first main voltage detection unit 31e detects a voltage (described as an "H" in FIG. 9) equal to or higher than the threshold value, and the second main voltage detection unit 31f detects a voltage (described as an "H" in FIG. 9) equal to or higher than the threshold value. Accordingly, an on failure of the second main semiconductor switch 31d can be detected.

Here, the main side microcomputer 31i executes control to terminate the failure diagnosis based on the detection of the failure of the second main semiconductor switch 31d in the second diagnosis state D2.

As shown in FIGS. 4 and 10, the sub side microcomputer 32o diagnoses, in the second diagnosis state D2 in which the first sub semiconductor switch 32c, the second sub semiconductor switch 32d, the third sub semiconductor switch 32l, and the fourth sub semiconductor switch 32m are turned off, the failure of the first sub semiconductor switch 32c (described as "MAB upstream" in FIG. 4) based on the voltage values detected by the first sub voltage detection unit 32e, the second sub voltage detection unit 32f, and the third sub voltage detection unit 32g.

When the first sub semiconductor switch 32c is normal, the first sub voltage detection unit 32e detects a voltage (described as an "H" in FIG. 10) equal to or higher than the threshold value, the second sub voltage detection unit 32f detects a voltage (described as an "L" in FIG. 10) below the threshold value, and the third sub voltage detection unit 32g detects a voltage (described as an "L" in FIG. 10) below the threshold value.

When the first sub semiconductor switch 32c fails, the first sub voltage detection unit 32e detects a voltage (described as an "H" in FIG. 10) equal to or higher than the threshold value, the second sub voltage detection unit 32*f* detects a voltage (described as an "H" in FIG. 10) equal to or higher than the threshold value, and the third sub voltage detection unit 32*g* detects a voltage (described as an "H" in FIG. 10) equal to or higher than the threshold value. Accordingly, an on failure of the first sub semiconductor switch 32*c* can be detected.

Here, the sub side microcomputer 32*o* executes control to terminate the failure diagnosis based on the detection of the failure of the first sub semiconductor switch 32*c* in the second diagnosis state D2.

As shown in FIGS. 4 and 11, the sub side microcomputer 32*o* diagnoses, in the second diagnosis state D2 in which the first sub semiconductor switch 32*c*, the second sub semiconductor switch 32*d*, the third sub semiconductor switch 32*l*, and the fourth sub semiconductor switch 32*m* are turned off, the failure of the fourth sub semiconductor switch 32*m* (described as "MA2 upstream" in FIG. 4) based on voltage values detected by the second sub voltage detection unit 32*f*, the third sub voltage detection unit 32*g*, and the fourth sub voltage detection unit 32*n*.

When the fourth sub semiconductor switch 32*m* is normal, the second sub voltage detection unit 32*f* detects a voltage (described as an "L" in FIG. 11) below the threshold value, the third sub voltage detection unit 32*g* detects a voltage (described as an "L" in FIG. 11) below the threshold value, and the fourth sub voltage detection unit 32*n* detects a voltage (described as an "H" in FIG. 11) equal to or higher than the threshold value.

When the fourth sub semiconductor switch 32*m* fails, the second sub voltage detection unit 32*f* detects a voltage (described as an "L" in FIG. 11) below the threshold value, the third sub voltage detection unit 32*g* detects a voltage (described as an "H" in FIG. 11) equal to or higher than the threshold value, and the fourth sub voltage detection unit 32*n* detects a voltage (described as an "H" in FIG. 11) equal to or higher than the threshold value. Accordingly, an on failure of the fourth sub semiconductor switch 32*m* can be detected.

Here, the sub side microcomputer 32*o* executes control to terminate the failure diagnosis based on the detection of the failure of the fourth sub semiconductor switch 32*m* in the second diagnosis state D2.

As shown in FIG. 4, after the second diagnosis state D2, the main side microcomputer 31*i* executes control to charge (precharge) the main capacitor 31*g* by supplying the power from the system power supply 102. At this time, the main side microcomputer 31*i* does not execute the third diagnosis state D3 based on the detection of the charging abnormality of the main capacitor 31*g*.

Similarly, after the second diagnosis state D2, the sub side microcomputer 32*o* executes control to charge (precharge) the sub capacitor 32*h* by supplying the power from the system power supply 102. At this time, the sub side microcomputer 32*o* does not execute the third diagnosis state D3 based on the detection of the charging abnormality of the sub capacitor 32*h*.

As shown in FIG. 4, the main side microcomputer 31*i* executes control to discharge the main capacitor 31*g* before the third diagnosis state D3. The sub side microcomputer 32*o* executes control to discharge the sub capacitor 32*h* before the third diagnosis state D3.

After the discharging, the sub side microcomputer 32*o* executes control to determine whether to diagnose the failure of the second sub semiconductor switch 32*d* and whether to diagnose the failure of the fourth sub semiconductor switch 32*m* in the third diagnosis state D3 based on the type of the second sub side power supply 32*j*. Here, the sub side microcomputer 32*o* diagnoses both the failure of the second sub semiconductor switch 32*d* and the failure of the fourth sub semiconductor switch 32*m* in the third diagnosis state D3 based on the fact that the second sub side power supply 32*j* is a lithium battery.

As shown in FIGS. 4 and 12, the sub side microcomputer 32*o* executes control to diagnose, in the third diagnosis state D3 in which the third sub semiconductor switch 32*l* and the fourth sub semiconductor switch 32*m* are turned on, the failure of the second sub semiconductor switch 32*d* (described as "MAB reverse connection" in FIG. 4) based on the voltage values detected by the first sub voltage detection unit 32*e*, the second sub voltage detection unit 32*f*, and the third sub voltage detection unit 32*g*.

When the second sub semiconductor switch 32*d* is normal, the first sub voltage detection unit 32*e* detects a voltage (described as an "H" in FIG. 12) equal to or higher than the threshold value, the second sub voltage detection unit 32*f* detects a voltage (described as an "L" in FIG. 12) below the threshold value, and the third sub voltage detection unit 32*g* detects a voltage (described as an "H" in FIG. 12) equal to or higher than the threshold value.

When the second sub semiconductor switch 32*d* fails, the first sub voltage detection unit 32*e* detects a voltage (described as an "H" in FIG. 12) equal to or higher than the threshold value, the second sub voltage detection unit 32*f* detects a voltage (described as an "H" in FIG. 12) equal to or higher than the threshold value, and the third sub voltage detection unit 32*g* detects a voltage (described as an "H" in FIG. 12) equal to or higher than the threshold value. Accordingly, an on failure of the second sub semiconductor switch 32*d* can be detected.

As shown in FIGS. 4 and 13, the sub side microcomputer 32*o* diagnoses, in the third diagnosis state D3 in which the third sub semiconductor switch 32*l* and the fourth sub semiconductor switch 32*m* are turned on, the failure of the fourth sub semiconductor switch 32*m* (described as "MA2 upstream" in FIG. 4) based on the voltage values detected by the second sub voltage detection unit 32*f*, the third sub voltage detection unit 32*g*, and the fourth sub voltage detection unit 32*n*.

When the fourth sub semiconductor switch 32*m* is normal, the second sub voltage detection unit 32*f* detects a voltage (described as an "L" in FIG. 13) below the threshold value, the third sub voltage detection unit 32*g* detects a voltage (described as an "H" in FIG. 13) equal to or higher than the threshold value, and the fourth sub voltage detection unit 32*n* detects a voltage (described as an "H" in FIG. 13) equal to or higher than the threshold value.

When the fourth sub semiconductor switch 32*m* fails, the second sub voltage detection unit 32*f* detects a voltage (described as an "L" in FIG. 13) below the threshold value, the third sub voltage detection unit 32*g* detects a voltage (described as an "L" in FIG. 13) below the threshold value, and the fourth sub voltage detection unit 32*n* detects a voltage (described as an "H" in FIG. 13) equal to or higher than the threshold value. Accordingly, an off failure of the fourth sub semiconductor switch 32*m* can be detected.

Here, since a diagnosis result of the failure of the third sub semiconductor switch 32*l* is the same as a diagnosis result of the failure of the fourth sub semiconductor switch 32*m*, a diagnosis result of the failure of the fourth sub semiconductor switch 32*m* is diverted to a diagnosis result of the failure of the third sub semiconductor switch 32*l*.

Main Side Failure Diagnosis Processing

Figure 14:
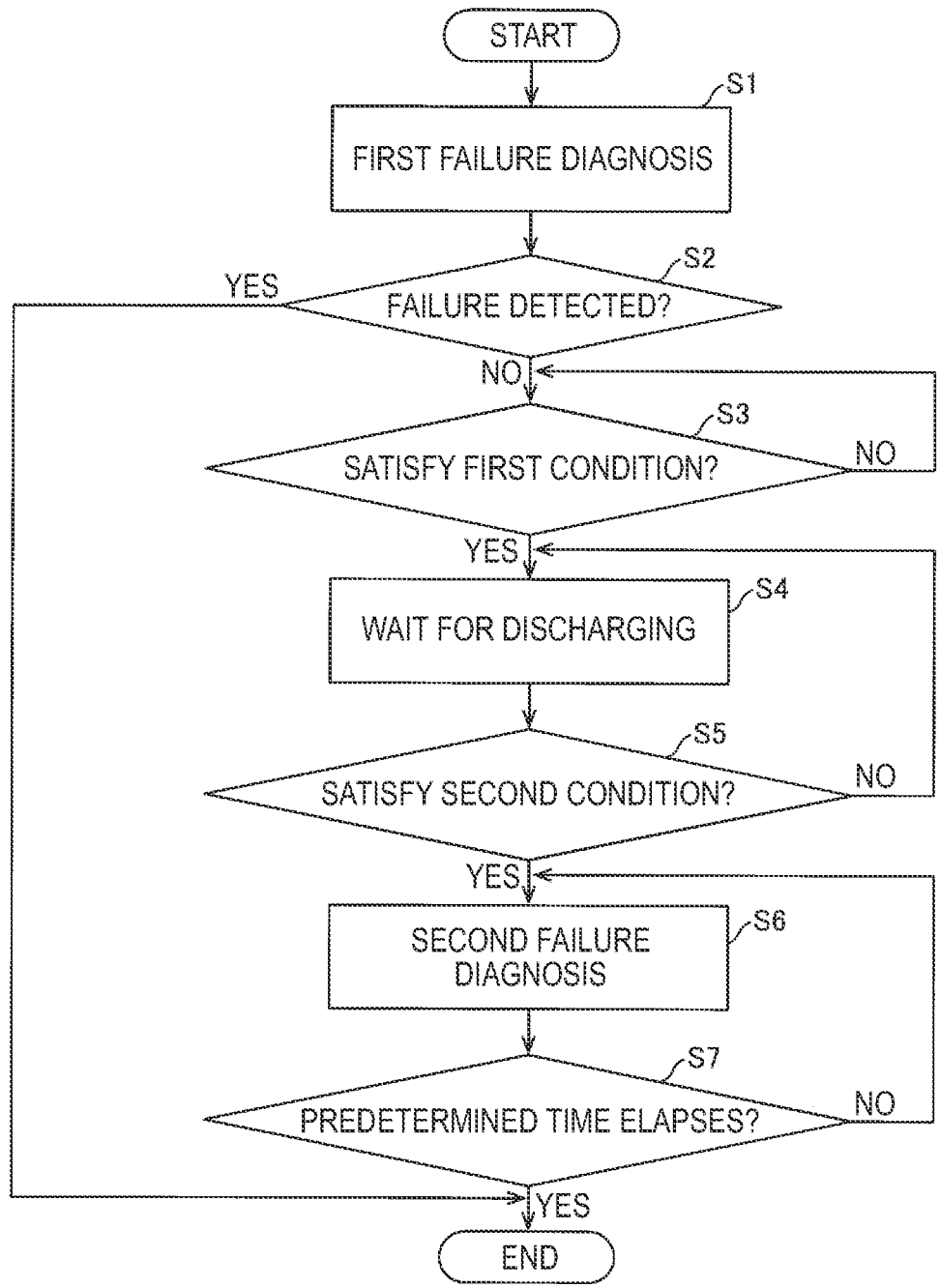
FIG. 14 is a flowchart showing main side failure diagnosis processing for the motor power supply device according to the first embodiment.

Hereinafter, main side failure diagnosis processing for the first main semiconductor switch 31c and the second main semiconductor switch 31d in the main side power supply unit 31 will be described with reference to FIG. 14.

In step S1, the main side microcomputer 31i executes a first failure diagnosis. That is, the main side microcomputer 31i executes an off failure diagnosis for the first main semiconductor switch 31c based on the voltage values of the first main voltage detection unit 31e and the second main voltage detection unit 31f in the first diagnosis state D1. The main side microcomputer 31i executes an off failure diagnosis for the second main semiconductor switch 31d based on the voltage values of the first main voltage detection unit 31e and the second main voltage detection unit 31f in the first diagnosis state D1.

In step S2, the main side microcomputer 31i determines whether a failure is detected in at least one of the first main semiconductor switch 31c and the second main semiconductor switch 31d. When the failure is detected, the main side failure diagnosis processing is terminated, and when no failure is detected, the processing proceeds to step S3. In step S3, the main side microcomputer 31i determines whether a first condition is satisfied. The first condition is a condition that an ignition switch is turned off, a failure diagnosis is changed from a prohibited state to a permitted state, the main capacitor 31g is normally charged, and driving of the motor 11 is stopped. When the first condition is satisfied, the processing proceeds to step S4, and when the first condition is not satisfied, step S3 is repeated.

In step S4, the main side microcomputer 31i waits until the main capacitor 31g is discharged. In step S5, the main side microcomputer 31i determines whether a second condition is satisfied. The second condition is a condition that a predetermined time elapses and both the first main semiconductor switch 31c and the second main semiconductor switch 31d are turned off. When the second condition is satisfied, the processing proceeds to step S6, and when the second condition is not satisfied, the processing returns to step S4.

In step S6, the main side microcomputer 31i executes a second failure diagnosis. That is, the main side microcomputer 31i executes an on failure diagnosis for the second main semiconductor switch 31d based on the voltage values of the first main voltage detection unit 31e and the second main voltage detection unit 31f in the second diagnosis state D2. In step S7, the main side microcomputer 31i determines whether the predetermined time elapses. When the predetermined time elapses, a main side failure diagnosis is terminated, and when the predetermined time does not elapse, the processing returns to step S6.

Sub Side Failure Diagnosis Processing

Figure 15:
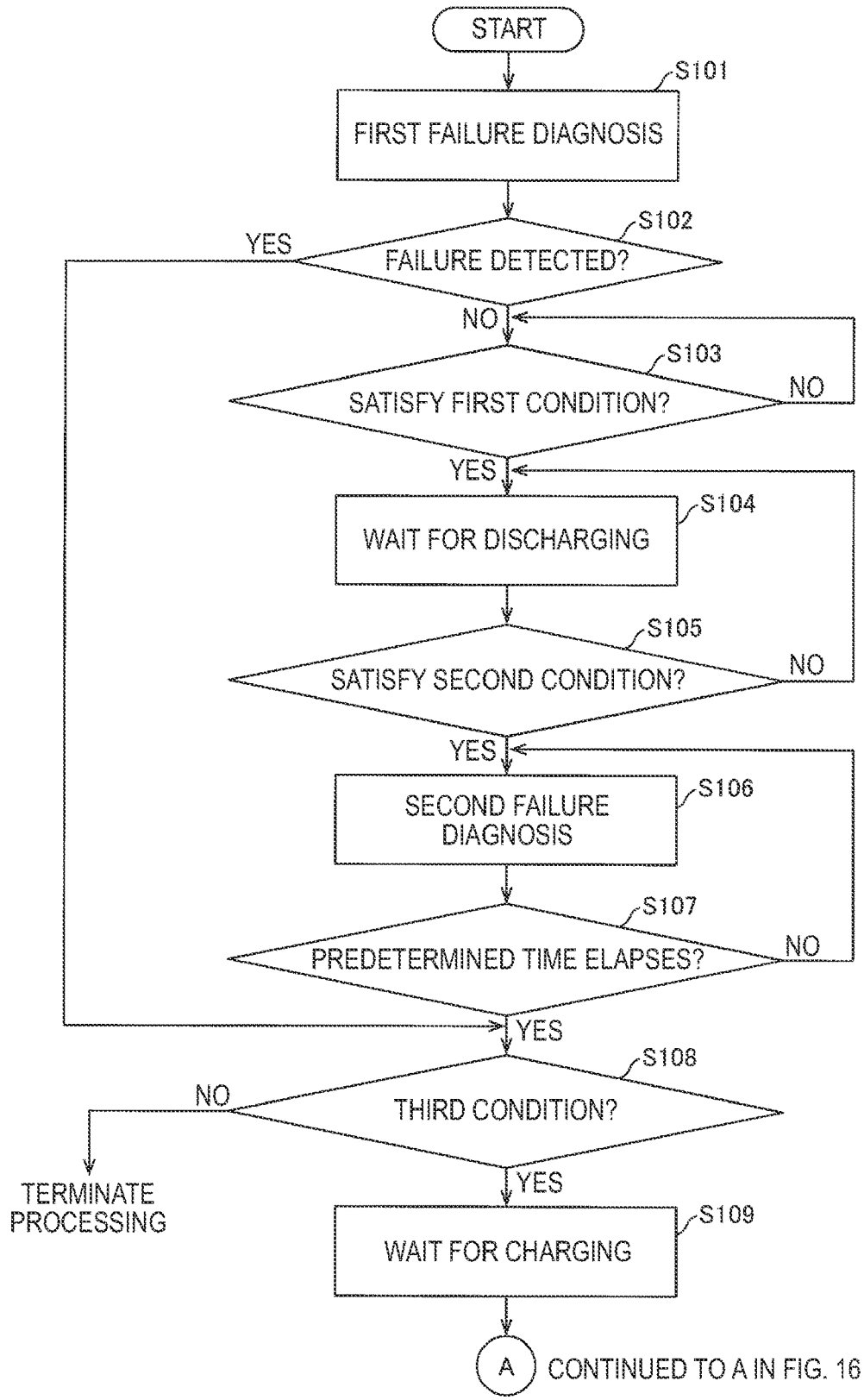
FIG. 15 is a flowchart showing a part of sub side failure diagnosis processing for the motor power supply device according to the first embodiment.

Hereafter, with reference to FIGS. 15 and 16, sub side failure diagnosis processing for the first sub semiconductor switch 32c, the second sub semiconductor switch 32d, the third sub semiconductor switch 32l, and the fourth sub semiconductor switch 32m in the sub side power supply unit 32 will be described.

In step S101, the sub side microcomputer 32o executes a first failure diagnosis. That is, the sub side microcomputer 32o executes an off failure diagnosis for the first sub semiconductor switch 32c based on the voltage values obtained by the first sub voltage detection unit 32e, the second sub voltage detection unit 32f, and the third sub voltage detection unit 32g in the first diagnosis state D1. The sub side microcomputer 32o executes an off failure diagnosis for the second sub semiconductor switch 32d based on the voltage values obtained by the first sub voltage detection unit 32e, the second sub voltage detection unit 32f, and the third sub voltage detection unit 32g in the first diagnosis state D1. The sub side microcomputer 32o executes an off failure diagnosis for the fourth sub semiconductor switch 32m based on the voltage values obtained by the second sub voltage detection unit 32f, the third sub voltage detection unit 32g, and the fourth sub voltage detection unit 32n in the first diagnosis state D1.

In step S102, the sub side microcomputer 32o determines whether a failure is detected in at least one of the first sub semiconductor switch 32c, the second sub semiconductor switch 32d, and the fourth sub semiconductor switch 32m. When the failure is detected, the sub side failure diagnosis processing is terminated, and when no failure is detected, the processing proceeds to step S103. In step S103, the sub side microcomputer 32o determines whether a first condition is satisfied. The first condition is a condition that an ignition switch is turned off, a failure diagnosis is changed from a prohibited state to a permitted state, the sub capacitor 32h is normally charged, and driving of the motor 11 is stopped. When the first condition is satisfied, the processing proceeds to step S104, and when the first condition is not satisfied, step S103 is repeated.

In step S104, the sub side microcomputer 32o waits until the sub capacitor 32h is discharged. In step S105, the sub side microcomputer 32o determines whether a second condition is satisfied. The second condition is a condition that a predetermined time elapses, and the first sub semiconductor switch 32c, the second sub semiconductor switch 32d, the third sub semiconductor switch 32l, and the fourth sub semiconductor switch 32m are all turned off. When the second condition is satisfied, the processing proceeds to step S6, and when the second condition is not satisfied, the processing returns to step S104.

In step S106, the sub side microcomputer 32o executes a second failure diagnosis. That is, the sub side microcomputer 32o executes an on failure diagnosis for the first sub semiconductor switch 32c based on the voltage values obtained by the first sub voltage detection unit 32e, the second sub voltage detection unit 32f, and the third sub voltage detection unit 32g in the second diagnosis state D2. The sub side microcomputer 32o executes an on failure diagnosis for the fourth sub semiconductor switch 32m based on the voltage values obtained by the second sub voltage detection unit 32f, the third sub voltage detection unit 32g, and the fourth sub voltage detection unit 32n in the second diagnosis state D2.

In step S107, the sub side microcomputer 32o determines whether the predetermined time elapses. When the predetermined time elapses, the processing proceeds to step S108, and when the predetermined time does not elapse, the processing returns to step S106. In step S108, the sub side microcomputer 32o determines whether a third condition is satisfied. The third condition is a condition that a power supply type of a second power supply 32j is not set, the power supply type of the second power supply 32j is a capacitor, or a failure is detected in the second failure diagnosis. When the second condition is satisfied, the sub side failure diagnosis processing is terminated, and when the second condition is not satisfied, the processing proceeds to step S109.

In step S109, the sub side microcomputer 32o waits until the sub capacitor 32h is charged. When the processing proceeds from A in FIG. 15 to A in FIG. 16, the processing proceeds from step S109 to step S110.

Figure 16:
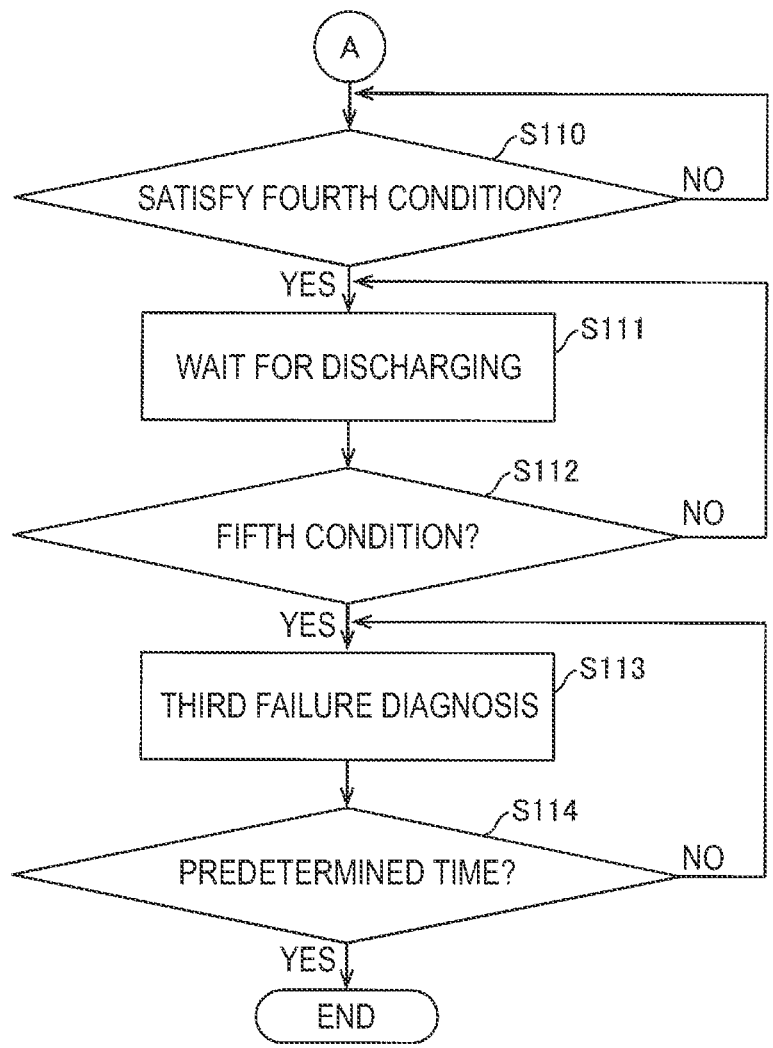
FIG. 16 is a flowchart showing the rest of the sub side failure diagnosis processing for the motor power supply device according to the first embodiment.

As shown in FIG. 16, in step S110, the sub side microcomputer 32o determines whether a fourth condition is satisfied. The fourth condition is a condition that the charging of the sub capacitor 32h is completed, the first sub semiconductor switch 32c is turned off, and the second sub semiconductor switch 32d is turned off, the third sub semiconductor switch 32l is turned on, and the fourth sub semiconductor switch 32m is turned on. When the fourth condition is satisfied, the processing proceeds to step S111, and when the fourth condition is not satisfied, step S110 is repeated. In step S111, the sub side microcomputer 32o waits until the sub capacitor 32h is discharged.

In step S112, the sub side microcomputer 32o determines whether a fifth condition is satisfied. The fifth condition is a condition that the predetermined time elapses, the first sub semiconductor switch 32c is turned off, the second sub semiconductor switch 32d is turned off, the third sub semiconductor switch 32l is turned on, and the fourth sub semiconductor switch 32m is turned on. When the fifth condition is satisfied, the processing proceeds to step S113, and when the fifth condition is not satisfied, the processing returns to step S111.

In step S113, the sub side microcomputer 32o executes a third failure diagnosis. That is, the sub side microcomputer 32o executes an on failure diagnosis for the second sub semiconductor switch 32d based on the voltage values obtained by the first sub voltage detection unit 32e, the second sub voltage detection unit 32f, and the third sub voltage detection unit 32g in the third diagnosis state D3. The sub side microcomputer 32o executes an off failure diagnosis for the fourth sub semiconductor switch 32m based on the voltage values obtained by the second sub voltage detection unit 32f, the third sub voltage detection unit 32g, and the fourth sub voltage detection unit 32n in the third diagnosis state D3.

In step S114, the sub side microcomputer 32o determines whether the predetermined time elapses. When the predetermined time elapses, the main side failure diagnosis processing is terminated, and when the predetermined time does not elapse, the processing returns to step S113.

Effects According to First Embodiment

In the first embodiment, the following effects can be attained.

In the first embodiment, as described above, the motor power supply device 3 includes the main side microcomputer 31i (sub side microcomputer 32o) that executes control to determine a state of power supply from the main side power supply 31a (first sub side power supply 32a) to the first main semiconductor switch 31c (first sub semiconductor switch 32c) based on a measured value obtained by the first main voltage detection unit 31e (first sub voltage detection unit 32e). Accordingly, even if a ground fault occurs between the main side power supply 31a (first sub side power supply 32a) and the first main semiconductor switch 31c (first sub semiconductor switch 32c) on the main power supply line 31b (first sub power supply line 32b), since the main side microcomputer 31i (sub side microcomputer 32o) can accurately determine the ground fault based on the measured value obtained by the first main voltage detection unit 31e (first sub voltage detection unit 32e), erroneous determination of the failure diagnosis can be prevented in the failure diagnosis of an on operation of the first main semiconductor switch 31c (first sub semiconductor switch 32c).

In the first embodiment, as described above, the motor power supply device 3 includes a second main voltage detection unit 31f that is disposed on the motor 11 side with respect to the second main semiconductor switch 31d on the main power supply line 31b, and that detects a voltage of the main power supply line 31b. The main side microcomputer 31i diagnoses, in the first diagnosis state D1 in which the first main semiconductor switch 31c and the second main semiconductor switch 31d are turned on, the failures of the first main semiconductor switch 31c and the second main semiconductor switch 31d based on the voltage values detected by the first main voltage detection unit 31e and the second main voltage detection unit 31f. Accordingly, since the failures of the first main semiconductor switch 31c and the second main semiconductor switch 31d can be diagnosed without disposing a voltage detection unit between the first main semiconductor switch 31c and the second main semiconductor switch 31d, an increase in the number of parts of the motor power supply device 3 (circuit) can be prevented.

In the first embodiment, as described above, the main side microcomputer 31i diagnoses, in the second diagnosis state D2 in which both the first main semiconductor switch 31c and the second main semiconductor switch 31d are turned off, the failure of the second main semiconductor switch 31d based on the voltage values detected by the first main voltage detection unit 31e and the second main voltage detection unit 31f. Accordingly, in a case of an on failure in which the first main semiconductor switch 31c cannot be released from an on state, since a voltage is detected by the second main voltage detection unit 31f when an on failure occurs in the second main semiconductor switch 31d and no voltage is detected by the second main voltage detection unit 31f when the second main semiconductor switch 31d is normal, a diagnosis result of the on failure of the second main semiconductor switch 31d can be diverted to a diagnosis result of the on failure of the first main semiconductor switch 31c. As a result, since diagnoses of on failures of the first main voltage detection unit 31e and the second main voltage detection unit 31f can be executed by only diagnosing the failure of the second main semiconductor switch 31d without diagnosing the failure of the first main semiconductor switch 31c, a processing load of a failure diagnosis in the main side microcomputer 31i can be reduced.

In the first embodiment, as described above, the motor power supply device 3 includes the second sub voltage detection unit 32f that is disposed between the first sub semiconductor switch 32c and the second sub semiconductor switch 32d, and that detects a voltage of the first sub power supply line 32b. The sub side microcomputer 32o diagnoses, in the first diagnosis state D1, the failure of the first sub semiconductor switch 32c and the second sub semiconductor switch 32d based on the voltage values detected by the first sub voltage detection unit 32e, the third sub voltage detection unit 32g, and the second sub voltage detection unit 32f. Accordingly, the failure of the first sub semiconductor switch 32c can be directly diagnosed by providing the second sub voltage detection unit 32f, accuracy of the diagnosis result of the first sub semiconductor switch 32c can be improved.

In the first embodiment, as described above, the motor power supply device 3 includes the second sub side power supply 32j that is provided separately from the first sub side power supply 32a, and the second sub power supply line 32k that electrically connects the second sub side power supply 32j and the motor 11. The motor power supply device 3 includes the third sub semiconductor switch 32l that is disposed on the second sub side power supply 32j side on the second sub power supply line 32k, and the fourth sub semiconductor switch 32m that is connected in series to the third sub semiconductor switch 32l on the second sub power supply line 32k and that is disposed on the output side of the second sub power supply line 32k. The motor power supply device 3 includes the fourth sub voltage detection unit 32n that is disposed on the second sub side power supply 32j side with respect to the third sub semiconductor switch 32l on the second sub power supply line 32k and that detects a voltage of the second sub power supply line 32k. The sub side microcomputer 32o diagnoses, in the second diagnosis state D2 in which the first sub semiconductor switch 32c, the third sub semiconductor switch 32l, the second sub semiconductor switch 32d, and the fourth sub semiconductor switch 32m are all turned off, the failures of the first sub semiconductor switch 32c and the fourth sub semiconductor switch 32m based on the voltage values detected by the first sub voltage detection unit 32e, the third sub voltage detection unit 32g, and the second sub voltage detection unit 32f. Accordingly, since a case in which a ground fault occurs between the second sub side power supply 32j and the third sub semiconductor switch 32l on the second sub power supply line 32k can be accurately determined by the fourth sub voltage detection unit 32n, erroneous determination of a failure diagnosis is prevented. Since the first sub semiconductor switch 32c can be directly diagnosed by diagnosing the failure of the first sub semiconductor switch 32c using the second sub voltage detection unit 32f, the on failure of the first sub semiconductor switch 32c can be accurately detected.

In the first embodiment, as described above, the sub side microcomputer 32o diagnoses, in the third diagnosis state D3 in which the third sub semiconductor switch 32l and the fourth sub semiconductor switch 32m are turned on, the failure of the second sub semiconductor switch 32d based on the voltage values detected by the first sub voltage detection unit 32e, the third sub voltage detection unit 32g, and the second sub voltage detection unit 32f, or the failure of the fourth sub semiconductor switch 32m based on the voltage values detected by the third sub voltage detection unit 32g, the second sub voltage detection unit 32f, and the fourth sub voltage detection unit 32n. Accordingly, the on failure of the second sub semiconductor switch 32d can be diagnosed without using the fourth sub voltage detection unit 32n. Thus, a processing load of the sub side microcomputer 32o when the on failure of the second sub semiconductor switch 32d is diagnosed can be reduced. The off failure of the fourth sub semiconductor switch 32m can be diagnosed without using the first sub voltage detection unit 32e. Thus, a processing load of the sub side microcomputer 32o when the off failure of the fourth sub semiconductor switch 32m is diagnosed can be reduced.

In the first embodiment, as described above, the motor power supply device 3 includes the main capacitor 31g (sub capacitor 32h) that is disposed on the main side power supply 31a (first sub side power supply 32a) side with respect to the second main voltage detection unit 31f (third sub voltage detection unit 32g) on the main power supply line 31b (first sub power supply line 32b) and that is precharged by the system power supply 102. The main side microcomputer 31i executes control to discharge the main capacitor 31g before the second diagnosis state D2. The sub side microcomputer 32o executes control to discharge the sub capacitor 32h before the second diagnosis state D2 and the third diagnosis state D3. Accordingly, the main capacitor 31g (sub capacitor 32h) can prevent an inrush current from flowing toward the second main voltage detection unit 31f (third sub voltage detection unit 32g). Since the second main voltage detection unit 31f (third sub voltage detection unit 32g) can detect a voltage that passes through a semiconductor switch by discharging the main capacitor 31g (sub capacitor 32h) before the motor power supply device 3 is brought into the second diagnosis state D2 or the third diagnosis state D3, the failure diagnosis of the semiconductor switch can be accurately executed in the motor power supply device 3.

Second Embodiment

Next, a motor power supply device 203 according to a second embodiment will be described with reference to FIGS. 17 to 19. In detail, in the motor power supply device 203 according to the second embodiment, a second sub side power supply 232j is a capacitor unlike the motor power supply device 3 according to the first embodiment in which the second sub side power supply 32j is a lithium battery. In the second embodiment, the same components as those according to the above first embodiment are denoted by the same reference signs, and a description thereof will be omitted.

Figure 17:
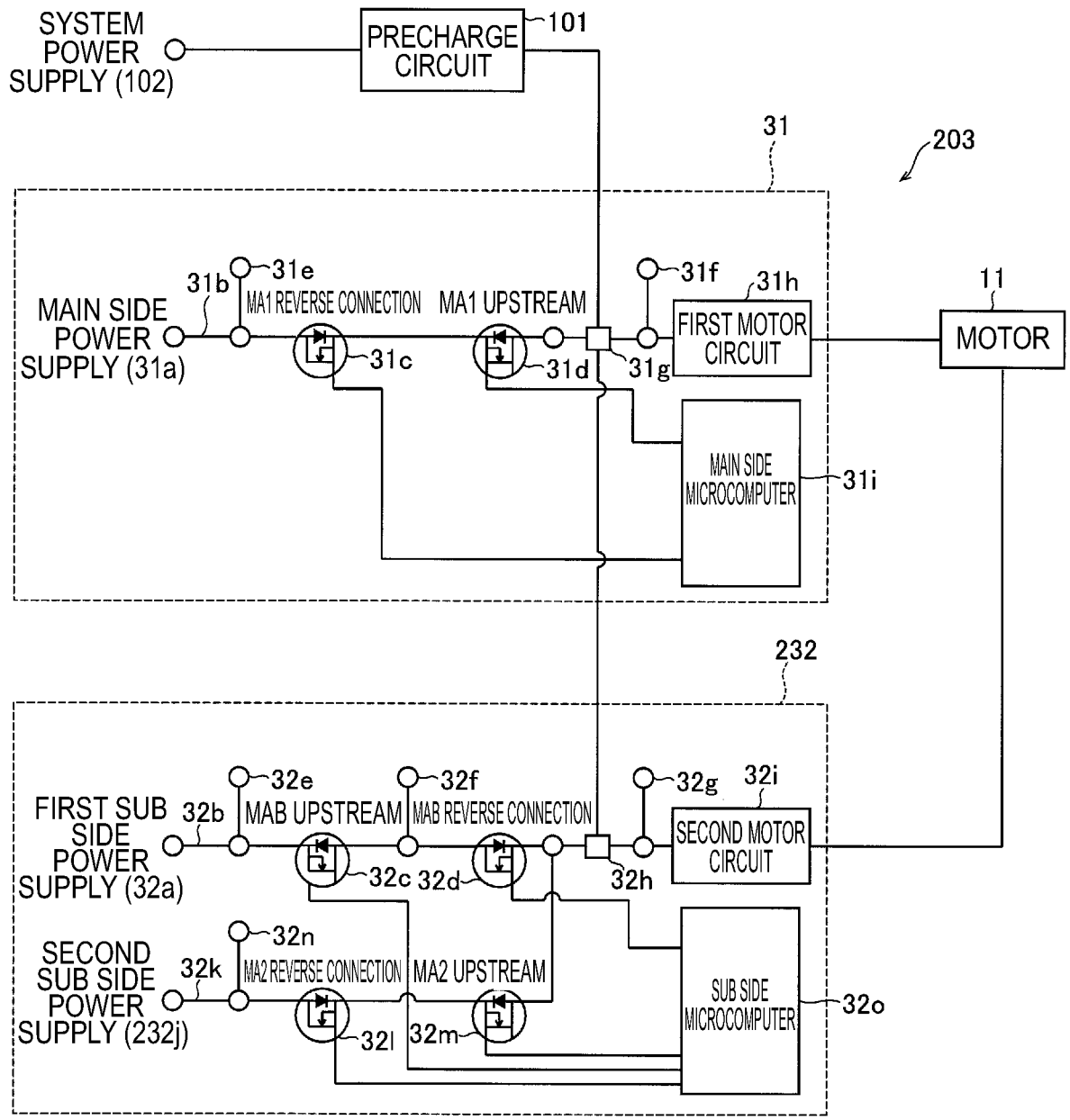
FIG. 17 is a view schematically showing a configuration of a motor power supply device according to a second embodiment.

As shown in FIG. 17, the motor power supply device 203 supplies a power to the motor 11. The motor power supply device 203 according to the second embodiment includes the main side power supply unit 31 and a sub side power supply unit 232. The motor 11 is driven by the power supplied from each of the main side power supply unit 31 and the sub side power supply unit 232.

The sub side power supply unit 232 includes the second sub side power supply 232j (an example of a "second power supply" in the claims), the second sub power supply line 32k (an example of a "second power supply line" in the claims), the third sub semiconductor switch 32l (an example of a "second power supply side semiconductor switch" in the claims), and the fourth sub semiconductor switch 32m (an example of a "second output side semiconductor switch" in the claims).

The second sub side power supply 232j is provided separately from the first sub side power supply 32a. The second sub side power supply 232j is a capacitor. Here, when the capacitor is used for the second sub side power supply 232j in the motor power supply device 3, a power is not supplied from the first sub side power supply 32a to the motor 11.

Failure Diagnosis

Figure 18:
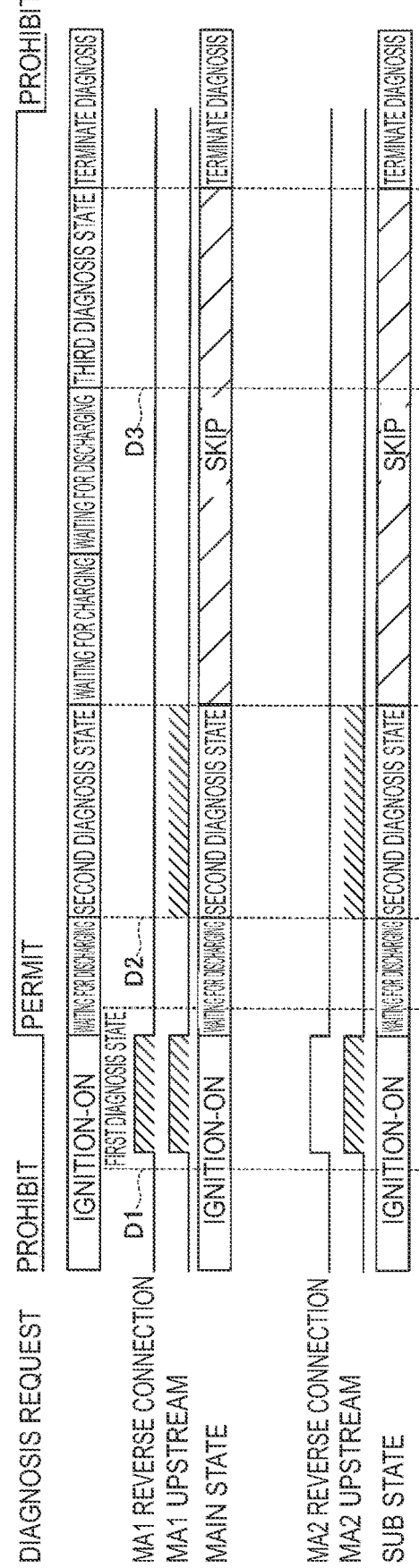
FIG. 18 is a timing chart of a failure diagnosis in the motor power supply device according to the second embodiment.

As shown in FIG. 18, the motor power supply device 3 is subjected to three types of failure diagnoses which are the first diagnosis state D1 (an example of a "first state" in the claims), the second diagnosis state D2 (an example of a "second state" and a "third state" in the claims), and the third diagnosis state D3 (an example of a "fourth state" in the claims). The first diagnosis state D1, the second diagnosis state D2, and the third diagnosis state D3 will be described below in this order.

A description of the same configuration as the first diagnosis state D1, the second diagnosis state D2, and the third diagnosis state D3 according to the first embodiment will be omitted. When the capacitor is used for the second sub side power supply 232j in the motor power supply device 3, the third diagnosis state D3 is not executed (skipped).

As shown in FIG. 18, similarly to the first embodiment, the main side microcomputer 31i diagnoses, in the first diagnosis state D1 in which the first main semiconductor switch 31c and the second main semiconductor switch 31d are turned on, failures of the first main semiconductor switch 31c (described as "MA1 reverse connection" in FIG. 18) and the second main semiconductor switch 31d (described as "MA1 upstream" in FIG. 18).

Figures 19, 20:
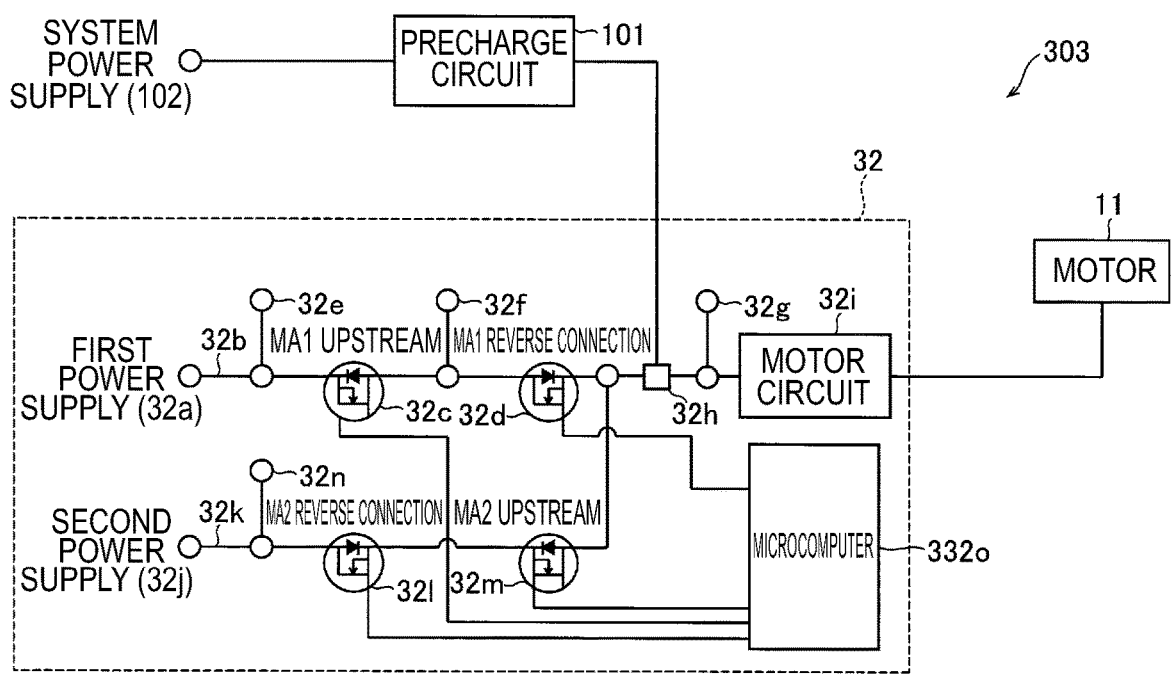
FIG. 19 is a table showing a diagnosis result of a fourth sub semiconductor switch of the motor power supply device in a second diagnosis state according to the second embodiment.
FIG. 20 is a view schematically showing a configuration of a motor power supply device according to a third embodiment.

As shown in FIGS. 18 and 19, the sub side microcomputer 32o diagnoses, in the first diagnosis state D1 in which the first sub semiconductor switch 32c and the second sub semiconductor switch 32d are turned on, a failure of the fourth sub semiconductor switch 32m (described as "MA2 upstream" in FIG. 18) based on voltage values detected by the second sub voltage detection unit 32f, the third sub voltage detection unit 32g, and the fourth sub voltage detection unit 32n.

When the fourth sub semiconductor switch 32m is normal, the second sub voltage detection unit 32f detects a voltage (described as an "L" in FIG. 19) below a threshold value, the third sub voltage detection unit 32g detects a voltage (described as an "H" in FIG. 19) equal to or higher than the threshold value, and the fourth sub voltage detection unit 32n detects a voltage (described as an "H" in FIG. 19) equal to or higher than the threshold value.

When the fourth sub semiconductor switch 32m fails, the second sub voltage detection unit 32f detects a voltage (described as an "L" in FIG. 19) below the threshold value, the third sub voltage detection unit 32g detects a voltage (described as an "L" in FIG. 19) below the threshold value, and the fourth sub voltage detection unit 32n detects a voltage (described as an "H" in FIG. 19) equal to or higher than the threshold value. Accordingly, an off failure of the fourth sub semiconductor switch 32m can be detected.

As shown in FIG. 18, similarly to the first embodiment, the main side microcomputer 31i diagnoses failures of the second main semiconductor switch 31d and the fourth sub semiconductor switch 32m in the second diagnosis state D2. The other configurations according to the second embodiment are the same as those according to the first embodiment.

Effects According to Second Embodiment

In the second embodiment, the following effects can be attained.

In the second embodiment, as described above, the motor power supply device 203 includes the main side microcomputer 31i (sub side microcomputer 32o) that executes control to determine a state of power supply from the main side power supply 31a (first sub side power supply 32a) to the first main semiconductor switch 31c (first sub semiconductor switch 32c) based on a measured value obtained by the first main voltage detection unit 31e (first sub voltage detection unit 32e). Accordingly, in the failure diagnosis for the first main semiconductor switch 31c (first sub semiconductor switch 32c), erroneous determination of the failure diagnosis can be prevented.

In the second embodiment, as described above, the sub side microcomputer 32o diagnoses, in the first diagnosis state D1, the failure of the fourth sub semiconductor switch 32m based on the voltage values detected by the third sub voltage detection unit 32g, the second sub voltage detection unit 32f, and the fourth sub voltage detection unit 32n. Accordingly, since the off failure in which the fourth sub semiconductor switch 32m cannot be released from the off state can be diagnosed without using the first sub voltage detection unit 32e, a processing load of the sub side microcomputer 32o when the off failure of the fourth sub semiconductor switch 32m is diagnosed can be reduced. The other effects according to the second embodiment are the same as those according to the first embodiment.

Third Embodiment

Next, a motor power supply device 303 according to a third embodiment will be described with reference to FIG. 20. In detail, the motor power supply device 303 according to the third embodiment is provided with one microcomputer 332o unlike the motor power supply device 3 according to the first embodiment provided with the main side microcomputer 31i and the sub side microcomputer 32o. In the third embodiment, the same components as those according to the first embodiment are denoted by the same reference signs, and a description thereof will be omitted.

In the shift device 100 according to the third embodiment, the detent spring 22 holds a detent plate (not shown) at rotation angle positions each corresponding to a respective one of the P position and a non-P position.

As shown in FIG. 20, the motor power supply device 303 supplies a power to the actuator unit 1. The motor power supply device 303 includes the first power supply 32a, the first power supply line 32b, the first semiconductor switch 32c (an example of a "first power supply side semiconductor switch" in the claims), and the second semiconductor switch 32d (an example of a "first output side semiconductor switch" in the claims).

The motor power supply device 303 includes the first voltage detection unit 32e (an example of a "first power supply side voltage detection unit" in the claims), the second voltage detection unit 32f (an example of an "intermediate voltage detection unit" in the claims), and the third voltage detection unit 32g (an example of an "output side voltage detection unit" in the claims). The motor power supply device 303 includes the precharge capacitor 32h and the motor circuit 32i.

The motor power supply device 303 includes the second power supply 32j, a second power supply line 32k, the third semiconductor switch 32l (an example of a "second power supply side semiconductor switch" in the claims), and the fourth semiconductor switch 32m (an example of a "second output side semiconductor switch" in the claims). The second power supply 32j is provided separately from the first power supply 32a. The second power supply 32j is a capacitor or a lithium battery.

The motor power supply device 303 includes the fourth voltage detection unit 32n (an example of a "second power supply side voltage detection unit" in the claims) and the microcomputer 332o (an example of a "control unit" in the claims).

Failure Diagnosis

As shown in FIG. 21, the motor power supply device 303 is subjected to three types of failure diagnoses which are the first diagnosis state D1 (an example of a "first state" in the claims), the second diagnosis state D2 (an example of a "third state" in the claims), and the third diagnosis state D3 (an example of a "fourth state" in the claims).

Similarly, the microcomputer 332o executes control to charge (precharge) the precharge capacitor 32h by supplying the power from the system power supply 102 before the first diagnosis state D1. At this time, the microcomputer 332o does not execute the first diagnosis state D1 based on detection of a charging abnormality of the precharge capacitor 32h.

As shown in FIGS. 21 and 22, the microcomputer 332o diagnoses, in the first diagnosis state D1 in which the first semiconductor switch 32c and the second semiconductor switch 32*d* are turned on, a failure of the first semiconductor switch 32*c* (described as "MA1 upstream" in FIG. 21) based on voltage values detected by the first voltage detection unit 32*e*, the second voltage detection unit 32*f*, and the third voltage detection unit 32*g*. Since a diagnosis result of the failure of the first semiconductor switch 32*c* is the same as a diagnosis result of the first sub semiconductor switch 32*c* in the first diagnosis state D1 according to the first embodiment, a description thereof will be omitted.

As shown in FIGS. 21 and 23, the microcomputer 332*o* diagnoses, in the first diagnosis state D1 in which the first semiconductor switch 32*c* and the second semiconductor switch 32*d* are turned on, a failure of the second semiconductor switch 32*d* (described as "MA1 reverse connection" in FIG. 21) based on the voltage values detected by the first voltage detection unit 32*e*, the second voltage detection unit 32*f*, and the third voltage detection unit 32*g*. Since a diagnosis result of the failure of the second semiconductor switch 32*d* is the same as a diagnosis result of the second sub semiconductor switch 32*d* in the first diagnosis state D1 according to the first embodiment, a description thereof will be omitted.

As shown in FIG. 21, the microcomputer 332*o* executes control to discharge the precharge capacitor 32*h* before the second diagnosis state D2 such that the power is supplied to the second voltage detection unit 32*f*.

As shown in FIGS. 21 and 24, the microcomputer 332*o* diagnoses, in the second diagnosis state D2 in which the first semiconductor switch 32*c*, the second semiconductor switch 32*d*, the third semiconductor switch 32*l*, and the fourth semiconductor switch 32*m* are turned off, the failure of the first semiconductor switch 32*c* (described as "MA1 upstream" in FIG. 4) based on the voltage values detected by the first voltage detection unit 32*e*, the second voltage detection unit 32*f*, and the third voltage detection unit 32*g*. Since a diagnosis result of the failure of the first semiconductor switch 32*c* is the same as a diagnosis result of the first sub semiconductor switch 32*c* in the second diagnosis state D2 according to the first embodiment, a description thereof will be omitted.

Here, the microcomputer 332*o* executes control to terminate the failure diagnosis based on detection of the failure of the first semiconductor switch 32*c* in the second diagnosis state D2.

As shown in FIGS. 21 and 25, the microcomputer 332*o* diagnoses, in the second diagnosis state D2 in which the first semiconductor switch 32*c*, the second semiconductor switch 32*d*, the third semiconductor switch 32*l*, and the fourth semiconductor switch 32*m* are turned off, a failure of the fourth semiconductor switch 32*m* (described as "MA2 upstream" in FIG. 21) based on voltage values detected by the second voltage detection unit 32*f*, the third voltage detection unit 32*g*, and the fourth voltage detection unit 32*n*. Since a diagnosis result of the failure of the fourth semiconductor switch 32*m* is the same as a diagnosis result of the fourth sub semiconductor switch 32*m* in the second diagnosis state D2 according to the first embodiment, a description thereof will be omitted.

Here, the microcomputer 332*o* executes control to terminate the failure diagnosis based on the detection of the failure of the fourth sub semiconductor switch 32*m* in the second diagnosis state D2.

As shown in FIG. 21, the microcomputer 332*o* executes control to discharge the precharge capacitor 32*h* before the third diagnosis state D3. After discharging, the microcomputer 332*o* executes control to determine whether to diagnose the failure of the second semiconductor switch 32*d* and whether to diagnose the failure of the fourth semiconductor switch 32*m* in the third diagnosis state D3 based on whether the second power supply 32*j* is not set. Here, the microcomputer 332*o* diagnoses both the failure of the second semiconductor switch 32*d* and the failure of the fourth semiconductor switch 32*m* in the third diagnosis state D3 based on the fact that the second power supply 32*j* is a capacitor or a lithium battery.

As shown in FIGS. 21 and 26, the microcomputer 332*o* executes control to diagnose, in the third diagnosis state D3 in which the third semiconductor switch 32*l* and the fourth semiconductor switch 32*m* are turned on, the failure of the second semiconductor switch 32*d* (described as "MA1 reverse connection" in FIG. 21) based on the voltage values detected by the first voltage detection unit 32*e*, the second voltage detection unit 32*f*, and the third voltage detection unit 32*g*. Since a diagnosis result of the failure of the second semiconductor switch 32*d* is the same as a diagnosis result of the second sub semiconductor switch 32*d* in the third diagnosis state D3 according to the first embodiment, a description thereof will be omitted.

As shown in FIGS. 21 and 27, the microcomputer 332*o* diagnoses, in the third diagnosis state D3 in which the third semiconductor switch 32*l* and the fourth semiconductor switch 32*m* are turned on, the failure of the fourth semiconductor switch 32*m* (described as "MA2 upstream" in FIG. 21) based on voltage values detected by the second voltage detection unit 32*f*, the third voltage detection unit 32*g*, and the fourth voltage detection unit 32*n*. Since a diagnosis result of the failure of the fourth semiconductor switch 32*m* is the same as a diagnosis result of the fourth sub semiconductor switch 32*m* in the third diagnosis state D3 according to the first embodiment, a description thereof will be omitted.

Here, since a diagnosis result of a failure of the third semiconductor switch 32*l* is the same as the diagnosis result of the failure of the fourth semiconductor switch 32*m*, the diagnosis result of the failure of the fourth semiconductor switch 32*m* is diverted to the diagnosis result of the failure of the third semiconductor switch 32*l*.

In the motor power supply device 303, after the failure diagnosis is terminated, starting of the device is stopped based on a stop signal transmitted from an external system (vehicle control system). The other configurations according to the third embodiment are the same as those according to the first embodiment.

Failure Diagnosis Processing

Figure 28:
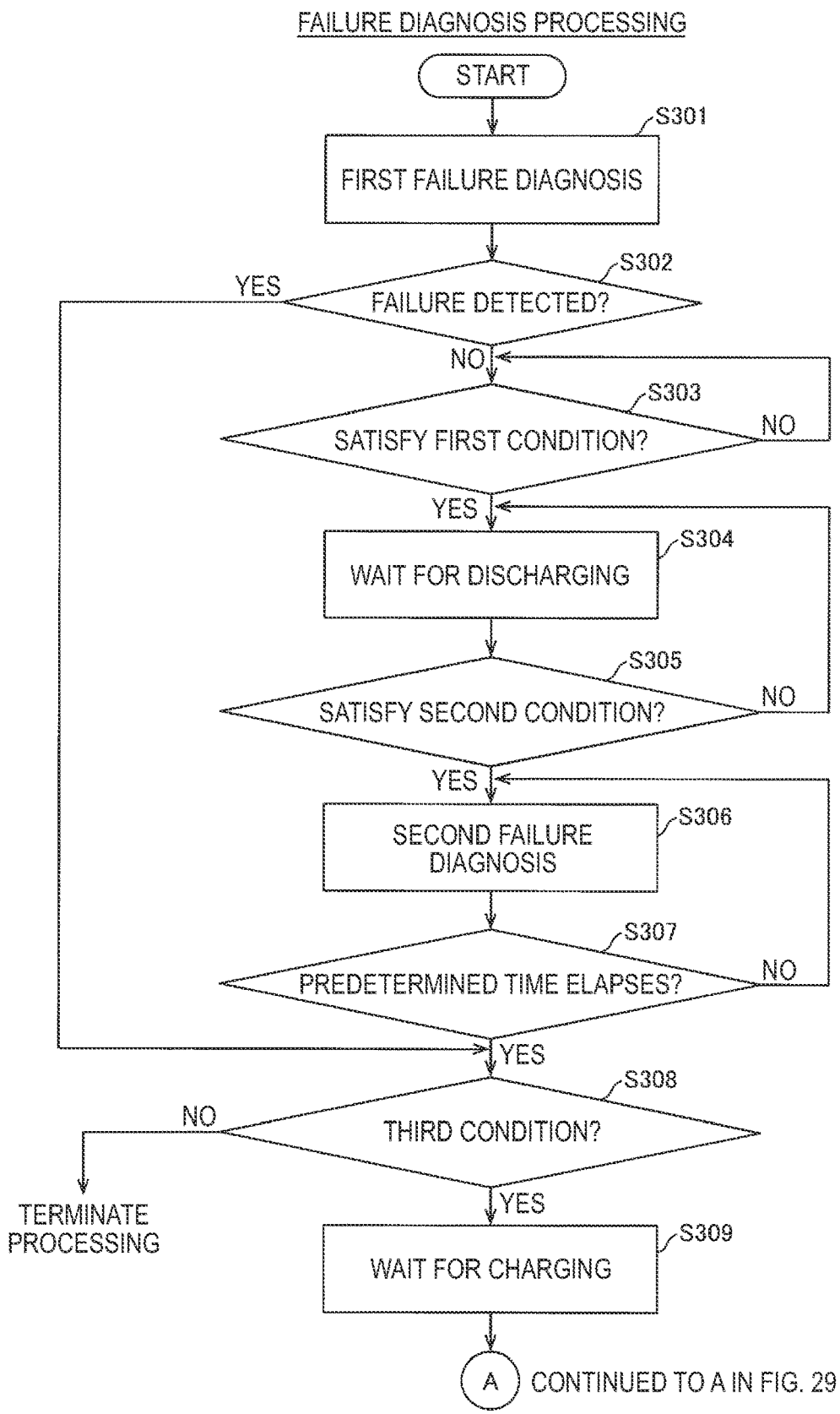
FIG. 28 is a flowchart showing a part of failure diagnosis processing for the motor power supply device according to the third embodiment.

Hereinafter, failure diagnosis processing for the first semiconductor switch 32*c*, the second semiconductor switch 32*d*, and the fourth semiconductor switch 32*m* will be described with reference to FIGS. 28 and 29.

In step S301, the microcomputer 332*o* executes a first failure diagnosis. That is, the microcomputer 332*o* executes the off failure diagnoses for the first semiconductor switch 32*c* and the second semiconductor switch 32*d* based on the voltage values obtained by the first voltage detection unit 32*e*, the second voltage detection unit 32*f*, and the third voltage detection unit 32*g* in the first diagnosis state D1.

In step S302, the microcomputer 332*o* determines whether a failure is detected in at least one of the first semiconductor switch 32*c* and the second semiconductor switch 32*d*. When the failure is detected, the failure diagnosis processing is terminated, and when no failure is detected, the processing proceeds to step S303. In step S303, the microcomputer 332*o* determines whether a first condition is satisfied. The first condition is a condition that an ignition switch is turned off, a failure diagnosis is changed from a prohibited state to a permitted state, the precharge capacitor 32h is normally charged, and driving of the motor 11 is stopped. When the first condition is satisfied, the processing proceeds to step S304, and when the first condition is not satisfied, step S303 is repeated.

In step S304, the microcomputer 332o waits until the precharge capacitor 32h is discharged. In step S305, the microcomputer 332o determines whether a second condition is satisfied. The second condition is a condition that a predetermined time elapses, and the first semiconductor switch 32c, the second semiconductor switch 32d, the third semiconductor switch 32l, and the fourth semiconductor switch 32m are all turned off. When the second condition is satisfied, the processing proceeds to step S306, and when the second condition is not satisfied, the processing returns to step S304.

In step S306, the microcomputer 332o executes a second failure diagnosis. That is, the microcomputer 332o executes an on failure diagnosis for the first semiconductor switch 32c based on the voltage values obtained by the first voltage detection unit 32e, the second voltage detection unit 32f, and the third voltage detection unit 32g in the second diagnosis state D2. The microcomputer 332o executes an on failure diagnosis for the fourth semiconductor switch 32m based on the voltage values obtained by the second voltage detection unit 32f, the third voltage detection unit 32g, and the fourth voltage detection unit 32n in the second diagnosis state D2.

In step S307, the microcomputer 332o determines whether the predetermined time elapses. When the predetermined time elapses, the processing proceeds to step S308, and when the predetermined time does not elapse, the processing returns to step S306. In step S308, the microcomputer 332o determines whether a third condition is satisfied. The third condition is a condition as to whether a power supply type of the second power supply 32j is not set, or whether a failure is detected in the second failure diagnosis. When the second condition is satisfied, the failure diagnosis processing is terminated, and when the second condition is not satisfied, the processing proceeds to step S309.

In step S309, the microcomputer 332o waits until the precharge capacitor 32h is charged. When the processing proceeds from A in FIG. 28 to A in FIG. 29, the processing proceeds from step S309 to step S310.

Figure 29:
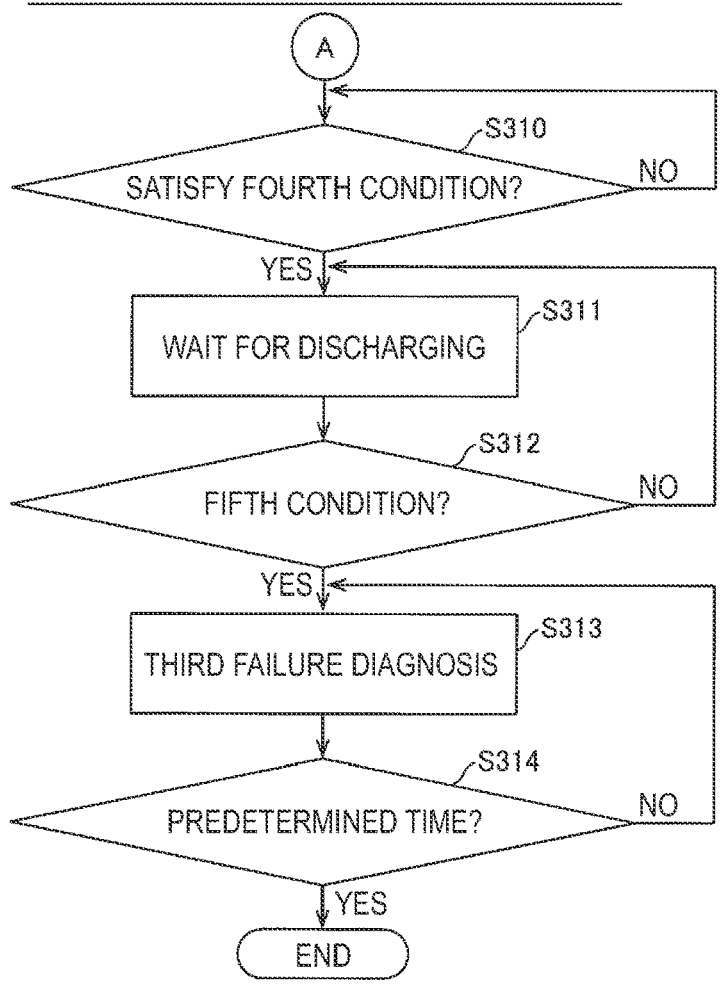
FIG. 29 is a flowchart showing the rest of the failure diagnosis processing for the motor power supply device according to the third embodiment.

As shown in FIG. 29, in step S310, the microcomputer 332o determines whether a fourth condition is satisfied. The fourth condition is a condition that the charging of the precharge capacitor 32h is completed, the first semiconductor switch 32c is turned off, and the second semiconductor switch 32d is turned off, the third semiconductor switch 32l is turned on, and the fourth semiconductor switch 32m is turned on. When the fourth condition is satisfied, the processing proceeds to step S311, and when the fourth condition is not satisfied, step S310 is repeated. In step S311, the microcomputer 332o waits until the precharge capacitor 32h is discharged.

In step S312, the microcomputer 332o determines whether a fifth condition is satisfied. The fifth condition is a condition that the predetermined time elapses, the first sub semiconductor switch 32c is turned off, the second sub semiconductor switch 32d is turned off, the third sub semiconductor switch 32l is turned on, and the fourth sub semiconductor switch 32m is turned on. When the fifth condition is satisfied, the processing proceeds to step S313, and when the fifth condition is not satisfied, the processing returns to step S311.

In step S313, the microcomputer 332o executes a third failure diagnosis. That is, the microcomputer 332o executes an on failure diagnosis for the second semiconductor switch 32d based on the voltage values obtained by the first sub voltage detection unit 32e, the second sub voltage detection unit 32f, and the third sub voltage detection unit 32g in the third diagnosis state D3. The microcomputer 332o executes an off failure diagnosis for the fourth semiconductor switch 32m based on the voltage values obtained by the second sub voltage detection unit 32f, the third sub voltage detection unit 32g, and the fourth sub voltage detection unit 32n in the third diagnosis state D3.

In step S314, the microcomputer 332o determines whether the predetermined time elapses. When the predetermined time elapses, the failure diagnosis processing is terminated, and when the predetermined time does not elapse, the processing returns to step S313.

Effects According to Third Embodiment

In the third embodiment, the following effects can be attained.

In the third embodiment, as described above, the motor power supply device 303 includes the microcomputer 332o that executes control to determine a state of power supply from the first power supply 32a to the first semiconductor switch 32c based on a measured value of the first voltage detection unit 32e. Accordingly, in the failure diagnosis for the first semiconductor switch 32c, erroneous determination of the failure diagnosis can be prevented. The other effects according to the third embodiment are the same as those according to the first embodiment.

Fourth Embodiment

Next, a motor power supply device 403 according to a fourth embodiment will be described with reference to FIGS. 30 and 31. In detail, the motor power supply device 403 according to the fourth embodiment is provided with a power supply 432a unlike the motor power supply device 303 according to the third embodiment provided with the first power supply 32a and the second power supply 32j. In the fourth embodiment, the same components as those according to the third embodiment are denoted by the same reference signs, and a description thereof will be omitted.

In the shift device 100 according to the fourth embodiment, the detent spring 22 holds a detent plate (not shown) at rotation angle positions each corresponding to a respective one of the P position and a non-P position.

Figure 30:
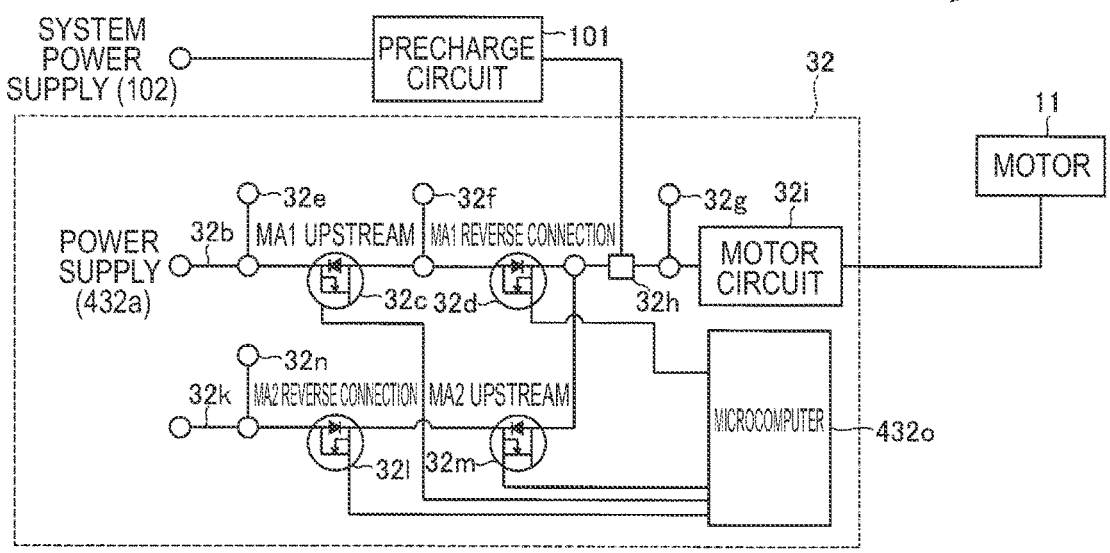
FIG. 30 is a view schematically showing a configuration of a motor power supply device according to a fourth embodiment.

As shown in FIG. 30, the motor power supply device 403 supplies a power to the actuator unit 1. The motor power supply device 403 includes the power supply 432a, the first power supply line 32b, the first semiconductor switch 32c (an example of a "first power supply side semiconductor switch" in the claims), and the second semiconductor switch 32d (an example of a "first output side semiconductor switch" in the claims).

The motor power supply device 403 includes the first voltage detection unit 32e (an example of a "first power supply side voltage detection unit" in the claims), the second voltage detection unit 32f (an example of an "intermediate voltage detection unit" in the claims), and the third voltage detection unit 32g (an example of an "output side voltage detection unit" in the claims). The motor power supply device 403 includes the precharge capacitor 32h, the motor circuit 32i, and a microcomputer 432o (an example of a "control unit" in the claims).

Failure Diagnosis

Figure 31:
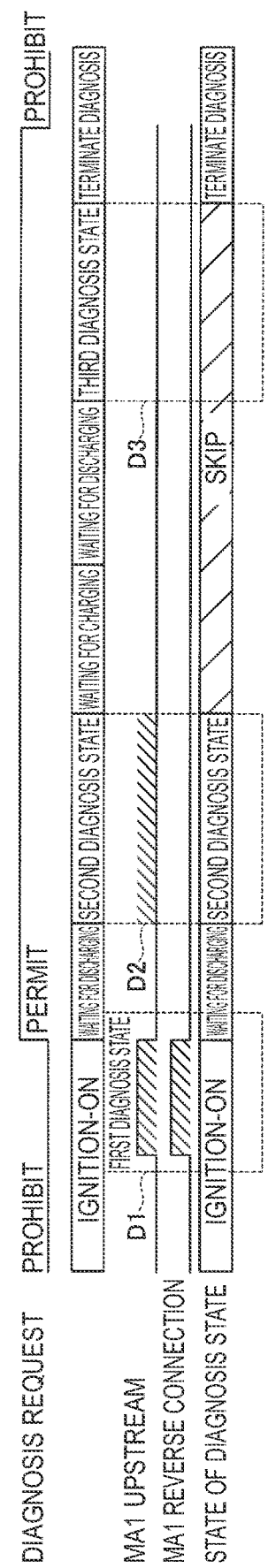
FIG. 31 is a timing chart of a failure diagnosis in the motor power supply device according to the fourth embodiment.

As shown in FIG. 31, the motor power supply device 403 is subjected to three types of failure diagnoses which are the first diagnosis state D1 (an example of a "first state" in the claims), the second diagnosis state D2 (an example of a "third state" in the claims), and the third diagnosis state D3 (an example of a "fourth state" in the claims).

Similarly, the microcomputer 432o executes control to charge (precharge) the precharge capacitor 32h by supplying the power from the system power supply 102 before the first diagnosis state D1. At this time, the microcomputer 432o does not execute the first diagnosis state D1 based on detection of a charging abnormality of the precharge capacitor 32h.

As shown in FIG. 31, the microcomputer 432o diagnoses, in the first diagnosis state D1 in which the first semiconductor switch 32c and the second semiconductor switch 32d are turned on, a failure of the first semiconductor switch 32c (described as "MA1 upstream" in FIG. 31) based on voltage values detected by the first voltage detection unit 32e, the second voltage detection unit 32f, and the third voltage detection unit 32g. Since a diagnosis result of the failure of the first semiconductor switch 32c is the same as a diagnosis result of the first semiconductor switch 32c in the first diagnosis state D1 according to the third embodiment, a description thereof will be omitted.

As shown in FIG. 31, the microcomputer 432o diagnoses, in the first diagnosis state D1 in which the first semiconductor switch 32c and the second semiconductor switch 32d are turned on, a failure of the second semiconductor switch 32d (described as "MA1 reverse connection" in FIG. 31) based on the voltage values detected by the first voltage detection unit 32e, the second voltage detection unit 32f, and the third voltage detection unit 32g. Since a diagnosis result of the failure of the second semiconductor switch 32d is the same as a diagnosis result of the second semiconductor switch 32d in the first diagnosis state D1 according to the third embodiment, a description thereof will be omitted.

As shown in FIG. 31, the microcomputer 432o executes control to discharge the precharge capacitor 32h before the second diagnosis state D2 such that the power is supplied to the second voltage detection unit 32f.

As shown in FIG. 31, the microcomputer 432o diagnoses, in the second diagnosis state D2 in which the first semiconductor switch 32c, the second semiconductor switch 32d, the third semiconductor switch 32l, and the fourth semiconductor switch 32m are turned off, the failure of the first semiconductor switch 32c (described as "MA1 upstream" in FIG. 31) based on the voltage values detected by the first voltage detection unit 32e, the second voltage detection unit 32f, and the third voltage detection unit 32g. Since a diagnosis result of the failure of the first semiconductor switch 32c is the same as a diagnosis result of the first semiconductor switch 32c in the second diagnosis state D2 according to the third embodiment, a description thereof will be omitted.

In the motor power supply device 403, since a power supply on the second power supply 32j side (backup side) according to the third embodiment is not set, the third diagnosis state D3 is not executed (skipped). The other configurations according to the fourth embodiment are the same as those according to the third embodiment.

Effects According to Fourth Embodiment

In the fourth embodiment, the following effects can be attained.

In the fourth embodiment, as described above, the motor power supply device 403 includes the microcomputer 432o that executes control to determine a state of power supply from the power supply 432a to the first semiconductor switch 32c based on a measured value obtained by the first voltage detection unit 32e. Accordingly, in the failure diagnosis for the first semiconductor switch 32c, erroneous determination of the failure diagnosis can be prevented. The other effects according to the fourth embodiment are the same as those according to the third embodiment.

Modification

It should be considered that the above-mentioned embodiments disclosed here are examples in all respects and are not restrictive. The scope disclosed here is shown by the claims rather than the description of the embodiment described above and further includes all changes (modifications) within the meaning and the scope equivalent to the claims.

For example, in the above-mentioned embodiments, an example has been shown in which the motor power supply device 3 (203, 303, 403) disclosed here is applied to the shift device 100 for an automobile, and this disclosure is not limited to this. In this disclosure, the motor power supply device may be applied to a shift device for a vehicle other than an automobile such as a train, or may be applied to a device other than the shift device.

In the above-mentioned embodiments, for convenience of description, an example has been shown in which control processing executed by the main side microcomputer 31i (control unit), the sub side microcomputer 32o (control unit), the microcomputer 332o (control unit), and the microcomputer 432o (control unit) are described with reference to a flow driving type flowchart for sequentially executing the processing according to a processing flow, and this disclosure is not limited thereto. In this disclosure, the control processing executed by the control unit may be executed by event driving type (event-driven type) processing in which the processing is executed in event units. In this case, the processing may be executed in a complete event driving type, or may be executed by combining the event driving type and the flow driving type.

According to an aspect of this disclosure, a motor power supply device includes: a first power supply; a motor that is driven by a power supplied from the first power supply; a first power supply line that electrically connects the first power supply and the motor; a first power supply side semiconductor switch that is disposed on a first power supply side on the first power supply line; a first output side semiconductor switch that is connected in series with the first power supply side semiconductor switch on the first power supply line and that is disposed on an output side of the first power supply line; a first power supply side voltage detection unit that is disposed on the first power supply side with respect to the first power supply side semiconductor switch on the first power supply line and that is configured to detect a voltage of the first power supply line; and a control unit configured to execute control to determine a state of power supply from the first power supply to the first power supply side semiconductor switch based on a measured value obtained by the first power supply side voltage detection unit.

The motor power supply device according to the aspect of this disclosure is provided with the control unit configured to execute control to determine a state of power supply from the first power supply to the first power supply side semiconductor switch based on the measured value obtained by the first power supply side voltage detection unit as described above. Accordingly, even if a ground fault occurs between the first power supply and the first power supply side semiconductor switch on the first power supply line, since the control unit can accurately determine the ground fault based on the measured value obtained by the first power supply side voltage detection unit, erroneous determination of a failure diagnosis can be prevented in failure diagnoses for on and off operations of the first power supply side semiconductor switch.

It is preferable that the motor power supply device according to the above aspect further includes an output side voltage detection unit that is disposed on a motor side with respect to the first output side semiconductor switch on the first power supply line and that is configured to detect a voltage of the first power supply line, in which the control unit is configured to diagnose, in a first state in which the first power supply side semiconductor switch and the first output side semiconductor switch are turned on, failures of the first power supply side semiconductor switch and the first output side semiconductor switch based on voltage values detected by the first power supply side voltage detection unit and the output side voltage detection unit.

With this configuration, since the failures of the first power supply side semiconductor switch and the first output side semiconductor switch can be diagnosed without disposing a voltage detection unit between the first power supply side semiconductor switch and the first output side semiconductor switch, an increase in the number of parts of the motor power supply device (circuit) can be prevented.

In this case, the control unit is preferably configured to diagnose, in a second state in which both the first power supply side semiconductor switch and the first output side semiconductor switch are turned off, the failure of the first output side semiconductor switch based on the voltage values detected by the first power supply side voltage detection unit and the output side voltage detection unit.

With this configuration, in a case of the on failure (short circuit failure) in which the first power supply side semiconductor switch cannot be released from an on state, since the voltage is detected by the output side voltage detection unit when an on failure occurs in the first output side semiconductor switch and no voltage is detected by the output side voltage detection unit when the first output side semiconductor switch is normal, a diagnosis result of an on failure of the first output side semiconductor switch can be diverted to a diagnosis result of the on failure of the first power supply side semiconductor switch. As a result, since diagnoses of the on failures of the first power supply side voltage detection unit and the output side voltage detection unit can be executed by only diagnosing the failure of the first output side semiconductor switch without diagnosing the failure of the first power supply side semiconductor switch, a processing load of a failure diagnosis in the control unit can be reduced.

It is preferable that the motor power supply device including the output side voltage detection unit further includes an intermediate voltage detection unit that is disposed between the first power supply side semiconductor switch and the first output side semiconductor switch and that is configured to detect a voltage of the first power supply line, in which the control unit is configured to diagnose, in the first state, the failures of the first power supply side semiconductor switch and the first output side semiconductor switch based on voltage values detected by the first power supply side voltage detection unit, the output side voltage detection unit, and the intermediate voltage detection unit.

With this configuration, since the failure of the first power supply side semiconductor switch can be directly diagnosed by providing the intermediate voltage detection unit, accuracy of the diagnosis result of the first power supply side semiconductor switch can be improved.

It is preferable that the motor power supply device including the intermediate voltage detection unit further includes: a second power supply that is provided separately from the first power supply; a second power supply line that electrically connects the second power supply and the motor; a second power supply side semiconductor switch that is disposed on a second power supply side on the second power supply line; a second output side semiconductor switch that is connected in series with the second power supply side semiconductor switch on the second power supply line and that is disposed on an output side of the second power supply line; and a second power supply side voltage detection unit that is disposed on the second power supply side with respect to the second power supply side semiconductor switch on the second power supply line and that is configured to detect a voltage of the second power supply line, in which the control unit is configured to diagnose, in a third state in which the first power supply side semiconductor switch, the second power supply side semiconductor switch, the first output side semiconductor switch, and the second output side semiconductor switch are all turned off, failures of the first power supply side semiconductor switch and the second output side semiconductor switch based on the voltage values detected by the first power supply side voltage detection unit, the output side voltage detection unit, and the intermediate voltage detection unit.

With this configuration, since a case in which a ground fault occurs between the second power supply and the second power supply side semiconductor switch on the second power supply line can be accurately determined by the second power supply side voltage detection unit, erroneous determination of the failure diagnosis can be prevented. Since the first power supply side semiconductor switch can be directly diagnosed by diagnosing the failure of the first power supply side semiconductor switch using the intermediate voltage detection unit, the on failure of the first power supply side semiconductor switch can be accurately detected.

In the motor power supply device including the second power supply side voltage detection unit, the control unit is preferably configured to diagnose, in the first state, the failure of the second output side semiconductor switch based on voltage values detected by the output side voltage detection unit, the intermediate voltage detection unit, and the second power supply side voltage detection unit.

With this configuration, since an off failure (open-circuit failure) in which the second output side semiconductor switch cannot be released from an off state can be diagnosed without using the first power supply side voltage detection unit, the processing load of the control unit when the off failure of the second output side semiconductor switch is diagnosed can be reduced.

In the motor power supply device including the second power supply side voltage detection unit, the control unit is preferably configured to diagnose, in a fourth state in which the second power supply side semiconductor switch and the second output side semiconductor switch are turned on, the failure of the first output side semiconductor switch based on the voltage values detected by the first power supply side voltage detection unit, the output side voltage detection unit, and the intermediate voltage detection unit, or the failure of the second output side semiconductor switch based on the voltage values detected by the output side voltage detection unit, the intermediate voltage detection unit, and the second power supply side voltage detection unit.

With this configuration, since an on failure of the first output side semiconductor switch can be diagnosed without using the second power supply side voltage detection unit, the processing load of the control unit when an off failure of the first output side semiconductor switch is diagnosed can be reduced. Since the off failure of the second output side semiconductor switch can be diagnosed without using the first power supply side voltage detection unit, the processing load of the control unit when the off failure of the second output side semiconductor switch is diagnosed can be reduced.

It is preferable that the motor power supply device configured to execute the failure diagnosis in the fourth state further includes a precharge capacitor that is disposed on the first power supply side with respect to the output side voltage detection unit on the first power supply line and that is precharged by an external power supply, in which the control unit is configured to execute control to discharge the precharge capacitor before the second state in which both the first power supply side semiconductor switch and the first output side semiconductor switch are turned off, the third state, and the fourth state.

With this configuration, the precharge capacitor can prevent an inrush current from flowing toward the output side voltage detection unit. Since the output side voltage detection unit can detect a voltage that passes through a semiconductor switch by discharging the precharge capacitor before the motor power supply device is brought into the second state, the third state, or the fourth state, a failure diagnosis for the semiconductor switch can be accurately executed in the motor power supply device.

According to the above aspect, the following configurations are also conceivable in the motor power supply device.

APPENDIX 1

That is, in the motor power supply device including the precharge capacitor, the control unit is configured to execute control to not diagnose the failures in the first state, the second state, the third state, and the fourth state based on an occurrence of a charging abnormality of the precharge capacitor.

With this configuration, it is possible to surely prevent the inrush current from flowing toward the output side voltage detection unit when the failures in the first state, the second state, the third state, and the fourth state are diagnosed, erroneous detection of the failure diagnosis of the semiconductor switch due to the inrush current can be prevented.

APPENDIX 2

In the motor power supply device including the output side voltage detection unit, the control unit is preferably configured to execute control to terminate the failure diagnosis based on the detection of the failure of at least one of the first power supply side semiconductor switch and the first output side semiconductor switch in the first state.

With this configuration, since the erroneous detection of the failure of the semiconductor switch due to a malfunction of at least one of the failed first power supply side semiconductor switch and the failed first output side semiconductor switch is prevented, the failure diagnosis for the semiconductor switch can be accurately executed in the motor power supply device. Since the failure diagnosis is terminated based on the detection of the failure of at least one of the first power supply side semiconductor switch and the first output side semiconductor switch in the first state, the processing load of the control unit can be reduced as compared with a case of continuing the failure diagnosis.

APPENDIX 3

In the motor power supply device configured to diagnose the failure of the first output side semiconductor switch in the second state, the control unit is configured to execute control to terminate the failure diagnosis based on the detection of the failure of the first output side semiconductor switch in the second state.

With this configuration, since the erroneous detection of the failure of the semiconductor switch due to a malfunction of the failed first output side semiconductor switch is prevented, the failure diagnosis of the semiconductor switch can be accurately executed in the motor power supply device. Since the failure diagnosis is terminated based on the detection of the failure of the first output side semiconductor switch in the second state, the processing load of the control unit can be reduced as compared with the case of continuing the failure diagnosis.

APPENDIX 4

In the motor power supply device configured to diagnose the failure of the first power supply side semiconductor switch in the third state, the control unit is configured to execute control to terminate the failure diagnosis based on the detection of the failure of the first power supply side semiconductor switch in the third state.

With this configuration, since the erroneous detection of the failure of the semiconductor switch due to a malfunction of the failed first power supply side semiconductor switch is prevented, the failure diagnosis for the semiconductor switch can be accurately executed in the motor power supply device. Since the failure diagnosis is terminated based on the detection of the failure of the first power supply side semiconductor switch in the third state, the processing load of the control unit can be reduced as compared with the case of continuing the failure diagnosis.

APPENDIX 5

In the motor power supply device configured to diagnose the failure of the first output side semiconductor switch or the second output side semiconductor switch in the fourth state, the control unit is configured to execute control to determine whether to diagnose the failure of the first output side semiconductor switch and whether to diagnose the failure of the second output side semiconductor switch in the fourth state based on the type of the second power supply.

With this configuration, the processing load of the control unit can be reduced as compared with the case in which the failure diagnosis for the semiconductor switch is executed in the fourth state regardless of the type of the second power supply.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A motor power supply device comprising:
   a first power supply;
   a motor that is driven by a power supplied from the first power supply;
   a first power supply line that electrically connects the first power supply and the motor;
   a first power supply side semiconductor switch that is disposed on a first power supply side on the first power supply line;
   a first output side semiconductor switch that is connected in series with the first power supply side semiconductor switch on the first power supply line and that is disposed on an output side of the first power supply line;
   a first power supply side voltage detection unit that is disposed on the first power supply side with respect to the first power supply side semiconductor switch on the first power supply line and that is configured to detect a voltage of the first power supply line;
   a control unit configured to execute control to determine a state of power supply from the first power supply to the first power supply side semiconductor switch based on a measured value obtained by the first power supply side voltage detection unit; and
   an output side voltage detection unit that is disposed on a motor side with respect to the first output side semiconductor switch on the first power supply line and that is configured to detect a voltage of the first power supply line, wherein
   the control unit is configured to diagnose, in a first state in which the first power supply side semiconductor switch and the first output side semiconductor switch are turned on, failures of the first power supply side semiconductor switch and the first output side semiconductor switch by comparing the voltage values detected by the first power supply side voltage detection unit and the output side voltage detection unit to a threshold.

2. The motor power supply device according to claim 1, wherein
   the control unit is configured to diagnose, in a second state in which both the first power supply side semiconductor switch and the first output side semiconductor switch are turned off, the failure of the first output side semiconductor switch based on the voltage values detected by the first power supply side voltage detection unit and the output side voltage detection unit.

3. The motor power supply device according to claim 1, further comprising:
   an intermediate voltage detection unit that is disposed between the first power supply side semiconductor switch and the first output side semiconductor switch and that is configured to detect a voltage of the first power supply line, wherein
   the control unit is configured to diagnose, in the first state, the failures of the first power supply side semiconductor switch and the first output side semiconductor switch based on voltage values detected by the first power supply side voltage detection unit, the output side voltage detection unit, and the intermediate voltage detection unit.

4. The motor power supply device according to claim 3, further comprising:
   a second power supply that is provided separately from the first power supply;
   a second power supply line that electrically connects the second power supply and the motor;
   a second power supply side semiconductor switch that is disposed on a second power supply side on the second power supply line;
   a second output side semiconductor switch that is connected in series with the second power supply side semiconductor switch on the second power supply line and that is disposed on an output side of the second power supply line; and
   a second power supply side voltage detection unit that is disposed on the second power supply side with respect to the second power supply side semiconductor switch on the second power supply line and that is configured to detect a voltage of the second power supply line, wherein
   the control unit is configured to diagnose, in a third state in which the first power supply side semiconductor switch, the second power supply side semiconductor switch, the first output side semiconductor switch, and the second output side semiconductor switch are all turned off, failures of the first power supply side semiconductor switch and the second output side semiconductor switch based on the voltage values detected by the first power supply side voltage detection unit, the output side voltage detection unit, and the intermediate voltage detection unit.

5. The motor power supply device according to claim 4, wherein
   the control unit is configured to diagnose, in the first state, the failure of the second output side semiconductor switch based on voltage values detected by the output side voltage detection unit, the intermediate voltage detection unit, and the second power supply side voltage detection unit.

6. The motor power supply device according to claim 4, wherein
   the control unit is configured to diagnose, in a fourth state in which the second power supply side semiconductor switch and the second output side semiconductor switch are turned on, the failure of the first output side semiconductor switch based on the voltage values detected by the first power supply side voltage detection unit, the output side voltage detection unit, and the intermediate voltage detection unit, or the failure of the second output side semiconductor switch based on the voltage values detected by the output side voltage detection unit, the intermediate voltage detection unit, and the second power supply side voltage detection unit.

7. The motor power supply device according to claim 6, further comprising:
   a precharge capacitor that is disposed on the first power supply side with respect to the output side voltage detection unit on the first power supply line and that is precharged by an external power supply, wherein
   the control unit is configured to execute control to discharge the precharge capacitor before the second state in which both the first power supply side semiconductor switch and the first output side semiconductor switch are turned off, the third state, and the fourth state.

\* \* \* \* \*